United States Patent
Daems et al.

(10) Patent No.: US 7,162,402 B2
(45) Date of Patent: Jan. 9, 2007

(54) POSYNOMIAL MODELING, SIZING, OPTIMIZATION AND CONTROL OF PHYSICAL AND NON-PHYSICAL SYSTEMS

(75) Inventors: Walter Daems, Mortsel (BE); Georges Gielen, Kessel-Lo (BE); Willy Sansen, Heverlee (BE)

(73) Assignee: Kimotion Technologies, Inc., Wilmington, DE (US)

( * ) Notice: Subject to any disclaimer, the term of this patent is extended or adjusted under 35 U.S.C. 154(b) by 279 days.

(21) Appl. No.: 10/494,151

(22) PCT Filed: Oct. 31, 2002

(86) PCT No.: PCT/BE02/00164

§ 371 (c)(1),
(2), (4) Date: Sep. 10, 2004

(87) PCT Pub. No.: WO03/038686

PCT Pub. Date: May 8, 2003

(65) Prior Publication Data

US 2005/0251373 A1    Nov. 10, 2005

(30) Foreign Application Priority Data

Oct. 31, 2001    (GB) ................... 0126104.9

(51) Int. Cl.
*G06G 7/62* (2006.01)

(52) U.S. Cl. .................. 703/13; 703/2; 716/2
(58) Field of Classification Search .......... 703/13, 703/2; 716/2, 1, 6

See application file for complete search history.

(56) References Cited

U.S. PATENT DOCUMENTS

| | | | | |
|---|---|---|---|---|
| 5,392,221 A | * | 2/1995 | Donath et al. ................. | 716/6 |
| 6,269,277 B1 | * | 7/2001 | Hershenson et al. .......... | 700/97 |
| 6,295,635 B1 | | 9/2001 | Dhaene et al. | |
| 6,311,145 B1 | * | 10/2001 | Hershenson et al. ........... | 703/2 |
| 6,415,417 B1 | * | 7/2002 | Tanaka et al. ................. | 716/2 |
| 7,065,727 B1 | * | 6/2006 | Hershenson et al. ........... | 716/8 |

OTHER PUBLICATIONS

Daems et al., "An Efficient Optimization-based Technique to Generate Posynomial Performance Models for Analog Integrated Circuits," Proceedings 2002 Design Automation Conference, Proceedings of 39th Design Automation Conference, New Orleans, LA, pp. 431-436 (Jun. 10-14, 2002).

(Continued)

*Primary Examiner*—Albert W. Paladini
(74) *Attorney, Agent, or Firm*—Trop, Pruner & Hu, PC

(57) ABSTRACT

Methods and apparatus are disclosed to automatically generate posynomial performance parameter models for linear and non-linear systems such as electronic circuit characteristics, based on numerical simulations, measurements or observation. The resulting models can be used for automated optimisation of the systems, e.g. optimization-based sizing of electronic circuits so that their performance meets the set of specifications imposed by the designer. They can also be used for optimizing the performance of the system such as the performance of an electronic circuit or to adjust or control the operation of the circuit. The methods and apparatus can be applied to any physical (e.g., electrical, chemical, mechanical, biological) or non physical (e.g., economical, financial, banking) system with which the input is performance values of the system rather than an analytical definition of the system, e.g. the input can be performance data obtained by simulation and/or by measurement and/or observation.

34 Claims, 23 Drawing Sheets

OTHER PUBLICATIONS

Daems et al., "Simulation-based Automatic Generation of Signomial and Posynomial Performance Models for Analog Integrated Circuit Sizing," IEEE/ACM International Conference on Computer Aided Design, ICCAD 2001, IEEE/ACM Digest of Technical Papers, IEEE/ACM International Conference on Computer Aided Design, ICAD 2001, IEEE/ACM Digest of Technical Papers, San Jose, CA, pp. 70-74 (2001).

Hershenson et al., "Optimal Design of a CMOS Op-Amp via Geometric Programming," IEEE Transactions on Computer-Aided Design of Integrated Circuits and Systems, vol. 20, No. 1, pp. 1-21 (Jan. 2001).

Mandal et al., "CMOS Op-Amp Sizing Using a Geometric Programming Formulation," IEEE Transactions on Computer-Aided Design of Integrated Circuits and Systems, vol. 20, No. 1, pp. 22-38 (Jan. 2001).

Li et al., "Robust Analog/RF Circuit Design with Projection-Based Posynomial Modeling," IEEE, pp. 855-862 (2004).

* cited by examiner

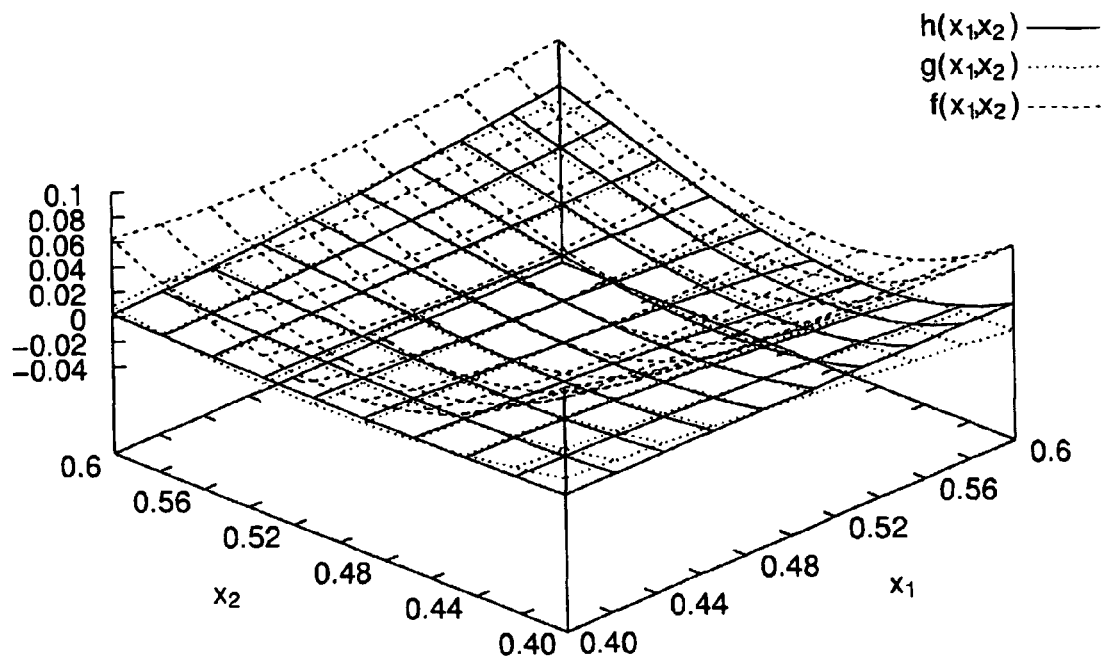

Figure 6

1. compose $\psi(C)$
2. set $\psi_{prev} = +\infty$
3. do
   3.1. do
      3.1.1. minimize $\psi(C)$ using a conjugate-gradient descent until $C$ contains a negative component or no further descent is possible
      3.1.2. set *sigcounter* = 0
      3.1.3. for $j = [2:m]$, do
         3.1.3.1. if $(c_j < 0)$, then
            3.1.3.1.1 *sigcounter* = *sigcounter* + 1
            3.1.3.1.2 $c_j = 0$;
      3.1.4. set *releasecounter* = 0
      3.1.5. for $j = [2:m]$, do
         3.1.5.1. if $((c_j == 0) \wedge (\nabla_{C,j}(\Psi) < 0))$, then
            3.1.5.1.1 release $c_j$
            3.1.5.1.2 *releasecounter* = *releasecounter* + 1
         3.1.5.2. else
            3.1.5.2.1 fix $c_j$
      until *sigcounter* == 0
   3.2. if (*releasecounter* == 0), then
      3.2.1. stop
   3.3. if $(|\psi(C) - \psi_{prev}| < \varepsilon)$, then
      3.3.1. stop
   3.4. else
      3.4.1. $\psi_{prev} = \psi(C)$
      3.4.2. cancel all releases and only release the $c_j$ that offers the largest axis-wise descent
   forever

```
File: Highspeed-ota.dsc
Circuit highspeed-ota {
 topology {
  nodes {
   node ndd;
   node 0;
   node nss;

node nin_p;
   node nin_m;

node n1;
   node n2a;
   node n2b;
   node n3;
   node nout;
   node n4a;
   node n4b;
   node n5;

node nbias1;
   node nbias2;
   node nbias3;
  }; // nodes devices {
   // supply voltage sources
   device vsrc - vdd(ndd, 0) {};
   device vsrc - vss(nss, 0) {};

// dc level of input
   device vsrc - vinp(nin_p, 0) {};
   device vsrc - vinm(nin_m, 0) {};

// bias current sources
   device isrc - ibias1(ndd, nbias1) {};
   device isrc - ibias2(nbias2, nss) {};
   device isrc - ibias3(nbias3, nss) {};

// circuit
   device mos na mbias1(nbias1, nbias1, nss, nss) {
    string sizecalculator = "minimal";
    string layoutestimator = "ss";
    real minw = 0.7e-6;
    real minl = 1.0e-6;
   };
   device mos pla mbias2(nbias2, nbias2, ndd, ndd) {
    string sizecalculator = "minimal";
```

Fig. 10b

```
    string layoutestimator = "ss";
    real minw = 0.7e-6;
    real minl = 1.2e-6;
};
device mos pla mbias3(nbias3, nbias3, ndd, ndd) {
    string sizecalculator = "minimal";
    string layoutestimator = "ss";
    real minw = 0.7e-6;
    real minl = 1.2e-6;
};
device mos pla m1a(n2a, nin_p, n1, n1) {
    string sizecalculator = "minimal";
    string layoutestimator = "ss";
    real minw = 0.7e-6;
    real minl = 1.2e-6;
};
device mos pla m1b(n2b, nin_m, n1, n1) {
    string sizecalculator = "minimal";
    string layoutestimator = "ss";
    real minw = 0.7e-6;
    real minl = 1.2e-6;
};
device mos na m2a(n3, nbias1, n2a, nss) {
    string sizecalculator = "minimal";
    string layoutestimator = "ss";
    real minw = 0.7e-6;
    real minl = 1.0e-6;
};
device mos na m2b(nout, nbias1, n2b, nss) {
    string sizecalculator = "minimal";
    string layoutestimator = "ss";
    real minw = 0.7e-6;
    real minl = 1.0e-6;
};
device mos na m3a(n2a, n3, nss, nss) {
    string sizecalculator = "minimal";
    string layoutestimator = "ss";
    real minw = 0.7e-6;
    real minl = 1.0e-6;
};
device mos na m3b(n2b, n3, nss, nss) {
    string sizecalculator = "minimal";
    string layoutestimator = "ss";
    real minw = 0.7e-6;
    real minl = 1.0e-6;
};
device mos pla m4a(n3, nbias2, n4a, n4a) {
    string sizecalculator = "minimal";
    string layoutestimator = "ss";
    real minw = 0.7e-6;
```

Fig. 10c

```
    real minl = 1.2e-6;
  };
  device mos pla m4b(nout, nbias2, n4b, n4b) {
    string sizecalculator = "minimal";
    string layoutestimator = "ss";
    real minw = 0.7e-6;
    real minl = 1.2e-6;
  };
  device mos pla m5a(n4a, nbias3, ndd, ndd) {
    string sizecalculator = "minimal";
    string layoutestimator = "ss";
    real minw = 0.7e-6;
    real minl = 1.2e-6;
  };
  device mos pla m5b(n4b, nbias3, ndd, ndd) {
    string sizecalculator = "minimal";
    string layoutestimator = "ss";
    real minw = 0.7e-6;
    real minl = 1.2e-6;
  };
  device mos pla m6(n5, nbias3, ndd, ndd) {
    string sizecalculator = "minimal";
    string layoutestimator = "ss";
    real minw = 0.7e-6;
    real minl = 1.2e-6;
  };
  device mos pla m7(n1, nbias2, n5, n5) {
    string sizecalculator = "minimal";
    string layoutestimator = "ss";
    real minw = 0.7e-6;
    real minl = 1.2e-6;
  };
  device cap - cl(nout, 0) {
    real c = 10e-12;
  };
 }; // devices
}; // topology technology {
    include "c07.dsm";
}; // technology environment {
  real temp = 300;
};

designinputs {
  voltage fixed 0(v(0)) {
    real value = 0.0;
  };
```

Fig. 10d

```
voltage fixed vdd(v(ndd, 0)) {
  real value = 2.5;
};
voltage fixed vss(v(nss, 0)) {
  real value = -2.5;
};
voltage range vsg1(v(n1, nin_p), v(n1, nin_m)) {
  real lobound = 0.75;
  real hibound = 4;
  string scale = "log";
};
voltage range vgs2(v(nbias1, n2a), v(nbias1, n2b)) {
  real lobound = 0.75;
  real hibound = 4;
  string scale = "log";
};
voltage range vds2(v(n2a, nss), v(n2b, nss)) {
  real lobound = 0.1;
  real hibound = 4;
  string scale = "log";
};
voltage range vsg3(v(n3, nss)) {
  real lobound = 0.75;
  real hibound = 4;
  string scale = "log";
};
voltage range vsg4(v(n4a, nbias2), v(n4b, nbias2)) {
  real lobound = 0.75;
  real hibound = 4;
  string scale = "log";
};
voltage range vsg5(v(ndd, nbias3)) {
  real lobound = 0.75;
  real hibound = 4;
  string scale = "log";
};
voltage range vsd5(v(ndd, n4a)) {
  real lobound = 0.1;
  real hibound = 4.0;
  string scale = "log";
};
voltage range vsd6(v(ndd, n5)) {
  real lobound = 0.1;
  real hibound = 4.0;
  string scale = "log";
};

voltage fixed vin(v(nin_p), v(nin_m)) {
  real value = 0.0;
};
```

Fig. 10e

```
voltage fixed vout(v(nout)) {
  real value = 0.0;
};
current range id1(i(m1a.drain), I(m1b.drain)) {
  real lobound = -1e-5;
  real hibound = -1e-2;
  string scale = "log";
};
current range id2(i(m2a.drain), I(m2b.drain)) {
  real lobound = 1e-5;
  real hibound = 1e-2;
  string scale = "log";
};
current range ib1(i(ibias1.p)) {
  real lobound = 1e-6;
  real hibound = 1e-4;
  string scale = "log";
};
current range ib2(i(ibias2.p)) {
  real lobound = 1e-6;
  real hibound = 1e-4;
  string scale = "log";
};
current range ib3(i(ibias3.p)) {
  real lobound = 1e-6;
  real hibound = 1e-4;
  string scale = "log";
};
}; // design inputs designoutputs {
 analysis linear {
  simulate ac(1.0, 1.0e9, 10) {
    input vinp = 0.5;
    input vinm = -0.5;
    output v(nout);
  };
  extract {
      action lfvalue(v, nout);
    action fu_pm(v, nout);
    scaler lfgain(lin) > 40;
    scaler fu(log) + 100e6;
    scaler pm(lin) > 60;
  };
 };
 analysis offset {
  simulate dc(-0.0025, 0.0025, 0.00025) {
    input vinp;
    output v(nout);
  };
```

Fig. 10 f

```
extract {
  action zerocrossing(v, nout);
  action duplicate();
  scaler offsetp(lin) < 1e-3;
  scaler offsetn(lin) > -1e-3;
 };
};
analysis srp {
 simulate tran(0.0, 1e-6, 1e-9) {
   input vinp = pwl(0, 0, 1n, 2.5);
   input vinm = pwl(0, 0, 1n, -2.5);
   output v(nout);
  };
  extract {
   action sr(v, nout);
    scaler srp(lin) > 40e6;
  };
};
analysis sm {
 simulate tran(0.0, 1e-6, 1e-9) {
   input vinp = pwl(0, 0, 1n, -2.5);
   input vinm = pwl(0, 0, 1n, 2.5);
   output v(nout);
  };
  extract {
   action sr(v, nout);
   scaler sm(lin) < -40e6;
  };
 };
}; // design outputs
};
```

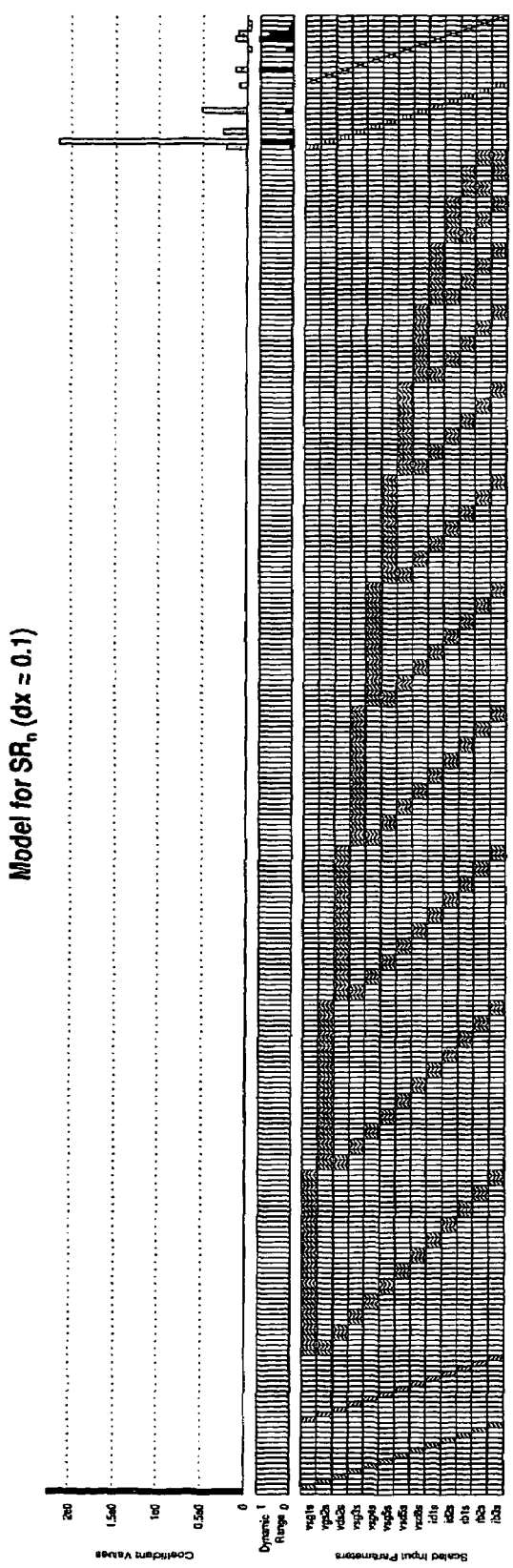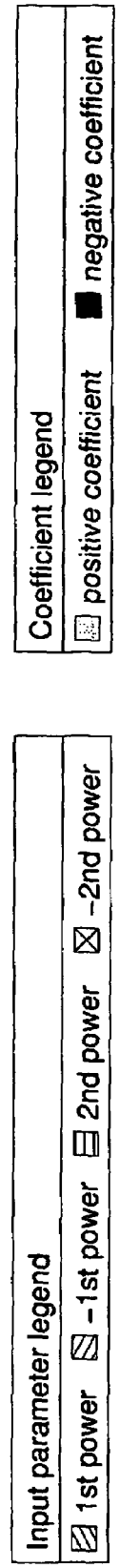
Fig. 12c
Figure 12

POSYNOMIAL MODELING, SIZING, OPTIMIZATION AND CONTROL OF PHYSICAL AND NON-PHYSICAL SYSTEMS

COPYRIGHT NOTICE

A portion of this disclosure contains material which is subject to copyright protection, e.g. algorithms. The copyright owner has no objection to copying of the patent application or patent document but otherwise reserves all copyright rights whatsoever.

1. Field of the Invention

The invention relates to the field of system modeling. In particular the present invention relates to generating posynomial models and apparatus therefor of any physical (e.g., electrical, chemical, mechanical, biological) or non physical (e.g., economical) system with which performance data is available e.g. via simulation and/or measurement and/or observation. The present invention may find application in electronic circuit design, more specifically, to the generation of analytical models for the performance characteristics of systems such as electronic circuits. The models can be used in the design, manufacture or operation of such systems, e.g. automatic sizing and optimization of these systems during the design and/or operation phase.

2. Background of the Invention

There are many applications in which it is advantageous to model a system. It is useful to be able to model the system in such a way that the problem solutions do not have local minima in cost functions or that these are avoidable. That is that the model is convex, having only one minimum. Casting the model in posynomial form and solving using geometric programming is one solution which provides this advantage. As an example, posynomial models have been proposed for the sizing of integrated circuits. Sizing is a time consuming and thus expensive step in the design of electronic circuits.

U.S. Pat. No. 5,880,967 suggests that convex programming is intractable and difficult to apply. It proposes linear programming as a solution.

Recently, it was demonstrated in [1], [2], [11], [12], [13], [14] that the sizing and optimization of analog integrated circuits, like amplifiers, switched-capacitor filters, LC oscillators, etc., can be formulated as a geometric program. The circuits are characterized with symbolic equations that have to be cast in posynomial format. The advantages of a geometric program are (1) that the problem is convex and therefore has only one global optimum, (2) that this optimum is not correlated with the optimization's starting point, and (3) that infeasible sets of constraints (i.e. that will not work) can be identified. In addition, the geometric program's optimum can be found extremely efficiently even for relatively large problems. The sizing is so fast (seconds) that design space explorations and process corner analysis can be performed quite easily. The approach, however, has a number of limitations 1. approximate symbolic equations that characterize the full circuit performance have to be derived. From these equations an attempt at posynomials is made. Despite the progress in computer-automated symbolic analysis techniques, these are still mainly limited to small-signal characteristics, necessitating the manual derivation of large-signal and transient characteristics (see e.g. [1] and [2]);
2. the equations have be to cast in posynomial format. Although it has been shown that many circuit characteristics are posynomial, this is not the case for all characteristics. In this case, the equations have to be approximated by some posynomial model. This is a manual effort with difficult control on the approximation error;
3. the device models in the published papers ([1] and [2]) are approximated in posynomial format. This introduces an extra error, especially for deep submicron CMOS processes. The results will differ from well established and accepted models like BSIM-3v3, used and trusted by designers today.

EP 223 526 describes a method of optimizing electronic circuits, however the method uses aanalytic functions or lump circuit analysis to generate the models.

U.S. Pat. No. 6,269,277 describes use of geometric programming and posynomial models. The posynomials are generated by known symbolic analyzers such as ISAAC or SYNAP. However, these known methods rely on analytic functions to define the system which are then re-cast as posynomials. Generally, some manual work is required.

The non-pre-published U.S. Pat. No. 6,425,111 does describe a method of obtaining posynomial-like functions by fitting monomials to performance curves, however the method is not general for posynomials as it is restricted to monomials. The use of straight line fitting in data segments introduces errors when the straight lines begin to diverge considerably from the measured or simulated performance values, e.g. at the junctions between two straight line approximations.

SUMMARY OF THE INVENTION

There is a need for a more general method and apparatus for generating posynomials to model systems which can then be used in powerful optimisation programs, e.g. using geometric programming.

The above need is solved by the methods and apparatus defined in the attached claims.

A method is disclosed to automatically generate posynomial models using performance data of the system. This numerical performance data can be obtained by simulation and/or by measurement and/or by observation. No particular limitation is anticipated for the type of physical or non-physical system which can be modeled provided the numerical data of its performance can be obtained and the system behaves in a repeatable manner. For example, for electronic circuits the characteristics can be found by numerical SPICE simulations using accurate device models. For methods according to the present invention:

1. no a-priori generation of simplified equations is needed: e.g. the models are built from SPICE simulations which only output numerical data, not equations,
2. no manual recasting (which may involve approximation) of signomial models to posynomial models is needed. One aspect of the present invention is a computer executable algorithm and a computer system that automatically recasts a particular set of signomial models into posynomial models. In another aspect a method and apparatus to directly generate posynomial models avoiding the recasting of signomial or more general models into approximate posynomial models is provided.
3. the full accuracy of SPICE simulations and established device models, such as BSIM-3v3 or MM11, can be used to generate the input data from which the models may be generated.

The present invention provides a method to generate posynomial models for performance characteristics of a system based on numerical data of these performance characteristics by fitting a signomial model to the numerical data followed by an automatic recasting into a posynomial model. The signomial model can be an $n^{th}$ order polynomial. The recasting of signomial models to posynomial models is preferably performed in an automatic way. For instance, the automatic recasting can be controlled by a computer executable algorithm.

The present invention provides a method to generate posynomial models for the performance characteristics of a system based on numerical data of these performance characteristics by directly fitting a posynomial template to the numerical data, the posynomial template containing arbitrary real exponents.

The numerical data can be obtained by measurements, by observation or by numerical simulation. The system can be any physical system such as an electronic circuit, or a micro electro-mechanical system (MEMS).

The method may generate posynomial models for linear or nonlinear performance characteristics. The method may generate specification independent models and/or sparse models.

The present invention also includes a model obtained by any of the above methods.

The present invention includes a method to size or optimize electronic circuits based on models obtained by any of the above methods.

The posynomial models may be updated adaptively during the sizing or optimization iteration.

The above methods of posynomial performance modeling for designing systems such as electronic circuits are carried out without analytically analyzing the system, e.g. circuit, and/or without casting the resulting analytic equations in posynomial format and/or without approximating them in posynomial format. Therefore the present invention includes a method for generating posynomial performance parameter models without a-priori generation of a simplified equation or equations to describe the system being modeled.

The generation of the posynomial performance parameter model may be based on numerical simulation techniques such as SPICE-like simulations using any device models.

BRIEF DESCRIPTION OF THE FIGURES

FIG. 6: graphical representation of the input-output relationship ($h(x_1,x_2)$), the fitted second-order polynomial ($g(x_1, x_2)$), and the posynomial ($f(x_1,x_2)$) for the illustrative example of the indirect fitting method in accordance with an embodiment of the present invention.

FIG. 7: example of direct fitting algorithm in accordance with an embodiment of the present invention.

FIG. 10: listing of file: highspeed.dsc (netlist of the example operational transconductance amplifier) which can be used for simulation of performance data.

DETAILED DESCRIPTION OF THE INVENTION

The present invention will be described with reference to certain embodiments and drawings but the present invention is not limited thereto but only by the attached claims. The embodiments are given by way of example and the skilled person will appreciate that the teaching of the present invention goes beyond these specific examples and may be applied generally to both physical and non-physical systems. The present invention will mainly be described by way of applications in semiconductor devices and electronic circuits but the present invention may find wide application in applications in mechanical, chemical, biological, electrical and electronic systems. For example, there are many systems for which analytic functions are not available or are not accurate. For such systems it is often possible to perform a parametric study, either by simulation or by measurement to generate sets of data which record the hidden relationships between observed or simulated performance characteristics and changes in the design variables of the system. Some systems (e.g. predicting the weather) do not allow changes in the design values by human intervention. However, by observing such systems over a period of time the system variables change and can be recorded by observation of the numerical data. The numerical data may be reduced in size, e.g. by elimination of irrelevant variables by principle component analysis. The present invention uses such numerical data as an input to which a posynomial model is fitted. The posynomial can comprise the summation of at least two monomials. Further, the posynomial models generated by the present invention may be used with any suitable solver to solve the posynomials for a specific application, e.g. the use of geometric programming is included within the scope of the present invention as a solver.

1 Theoretical Basis of the Present Invention

1.1 Performance Modeling

Figure 1:
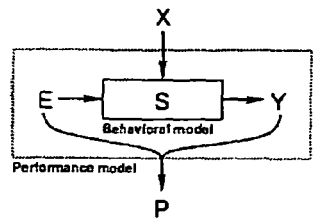
FIG. 1: Electronic system S parametrized by X with excitation E and response Y leading to a performance P

Consider a system S transforming an input signal E into an output signal Y (FIG. 1). The system S is governed by a set of design parameters X that influence its behavior.

$$Y = S(E, X) \quad (1)$$

The mathematical modeling of this input-output relationship is called behavioral modeling. The combination (Y,E) allows us to determine a particular performance $p_i$ of the system, subject to excitation E. A well chosen set of particular performances $p_i$ gives us an idea of the total performance of the system. These performances $p_i$ can be gathered into a vector P. Therefore, seen from a designer's point of view, the key relationship is:

$$P = F(X) \quad (2)$$

The mathematical modeling of this relationship is called performance modeling.

1.2 The Posynomial Modeling Problem

Posynomials and Geometric Programming

Let $X = (x_1, x_2, \ldots, x_n)^T$ be a vector of real, positive variables. An expression $f(X)$ is called signomial, if it has the form $$f(X) = \sum_{i=1}^{m} \left( c_i \prod_{j=1}^{n} \left( x_j^{\alpha_{ij}} \right) \right) \quad (3)$$

with $c_i \in$ {set of all real numbers} and $a_{ij} \in$ {set of all real numbers}.

If we restrict all $c_i$ to be positive, then the expression $f(X)$ is called posynomial. If eq. (3) is posynomial and m=1, then the expression $f(X)$ is called monomial.

A (primal) geometric program is the constrained optimization problem:

$$\text{minimize } f_0(X) \quad (4)$$

$$\text{with the constraints} \begin{cases} f_i(X) \leq 1 & i = 1, \ldots, p \\ g_j(X) = 1 & j = 1, \ldots, q \\ x_k > 0 & k = 1, \ldots, n \end{cases}$$

with all $f_i(X)$ posynomial and all $g_j(X)$ monomial.

By substituting all variables $x_k$ by $Z_k = \log(x_k)$ and taking the logarithm of the objective function $f_0(X)$ and every constraints $f_i, g_j$, it can be seen that the transformed problem is a convex optimization problem. Because of this, it has only one global optimum. In addition, this optimum can be found very efficiently using interior point methods (see ref. [3], [4]), even for large problems.

Scaling

Because the domain of the arguments of a posynomial function is restricted to the set of positive real numbers, the n-dimensional design space hypercube $$\{(x_1, x_2, \ldots, x_n) | x_i \in [lb_i, ub_i], \forall i \in [1:n]\} \quad (5)$$

is mapped onto the normalized n-dimensional hypercube $$\{(x_{1,s}, x_{2,s}, \ldots, x_{n,s}) | x_{i,s} \in [0,1], \forall i \in [1:n]\}. \quad (6)$$

These mapped variables are from now on considered to be the argument variables for the posynomial function that has to be generated.

Examples of these mappings are:

Linear mapping $$x_{i,s} = \frac{x_i - lb_i}{ub_i - lb_i} \quad (7)$$

Logarithmic mapping $$x_{i,s} = \log_{10}\left(\frac{x_i}{lb_i}\right) \Big/ \log_{10}\left(\frac{ub_i}{lb_i}\right) \quad (8)$$

However, any mapping onto the positive orthant (the set of all positive real numbers) can be used.

In view of the canonical geometric programming formulation of eq. (4), all performance constraints should be modeled in the normal form of eq. (4). Therefore, also the performance variables $p_i$ are scaled, e.g. using:

Linear scaling:

$$p_{i,scaled} = 1 \pm \frac{1}{W}(p_i - p_{i,spec}) \quad (9)$$

with W an arbitrary weight factor and $p_{i,spec}$ the user-specified performance. The plus sign (+) in the formula is used when the parameter $p_i$ needs to be minimized or appears in a $\leq$-constraint ($p_i \leq p_{i,spec}$). The minus sign (−) in the formula is used when the parameter needs to be maximized or appears in a $\geq$-constraint ($p_i \geq p_{i,spec}$).

Logarithmic scaling:

$$p_{i,scaled} = 1 \pm \frac{1}{W} \log_{10} \frac{p_i}{p_{i,spec}} \quad (10)$$

with W an arbitrary weight factor and $P_{i,spec}$ the user-specified performance. The plus sign (+) in the formula is used when the parameter $p_i$ needs to be minimized or appears in a $\leq$-constraint ($p_i \leq p_{i,spec}$). The minus sign (−) in the formula is used when the parameter needs to be maximized or appears in a $\geq$-constraint ($p_i \geq p_{i,spec}$).

Different scaling formulae can be used, if and only if $p_{i,scaled} = 1$ when $p_i = P_{i,spec}$. The scaling formulae (9) and (10) introduce no true dependence of the models on the design specifications since models generated using a particular specification set can be converted to a new arbitrary set of specifications by the simple addition or subtraction of a constant term. This operation does not harm the model's posynomiality. Therefore, using the scaling formulae of (9) and (10), the generated models are said to be "specification independent".

A goal of methods in accordance with the present invention is to solve the posynomial fitting problem.

In accordance with a first embodiment of the present invention a signomial fitting problem will first be defined.

Signomial Fitting Problem:
   Given a set of performance samples $$\{(X_1, p_{i,1}), (X_2, P_{i,2}), \ldots, (X_a, p_{i,a})\} \quad (11)$$

and a model template of type (3) with given exponents $a_{ij} \in$ {set of all real numbers}, determine coefficients $c_i$, with $c_i \in$ {set of all real numbers} such that $$\|[f(X_1), f(X_2), \ldots, f(X_a)]^T - [p_{i,1}, P_{i,2}, \ldots, p_{i,a}]\|_2 \quad (12)$$

is minimal.

Posynomial Fitting Problem:
   Solve the signomial fitting problem with the extra constraint $$c_i \geq 0, \forall i=1, \ldots, m \quad (13)$$

1.3 Overall Concept

Figure 2:
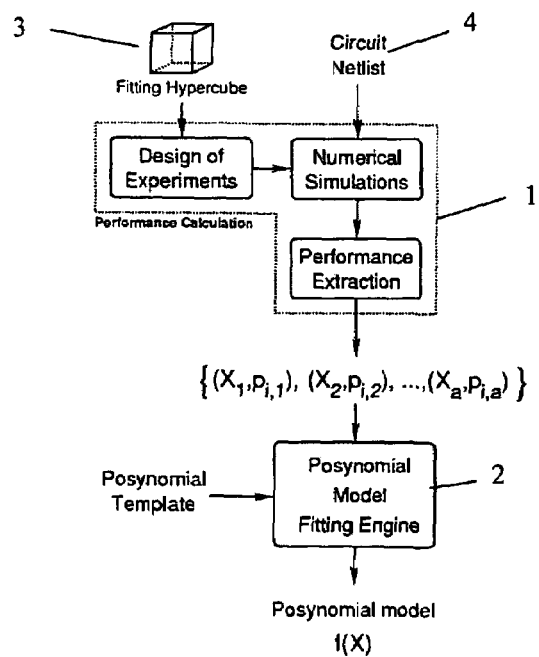
FIG. 2: schematic block diagram of embodiments of the present invention

An embodiment of the present invention will now be described using an electronic transistor-level circuit as vehicle system. However, the system for which models are generated can be any physical (e.g. electrical, chemical, mechanical, biological) or non-physical (e.g. economic, financial or banking) system. The only requirement for the system is that its behavior can be measured, observed or simulated, e.g. in the latter case that it can described using a set of analytical equations such as differential equations. In the latter case, it's behavior can be calculated (or simulated) by solving the set of differential equations numerically. The overall concept in which the two disclosed methods fit, is indicated in FIG. 2. The approach consists of the steps: provision of performance data in step 1 and model fitting in step 2 to this performance data. Optionally a third step of model quality assessment may be provided. The performance data may be measured, e.g. design variables of the system are varied and the response is measured. This may be done as a parametric study in which the design variables are varied systematically and the response of the system recorded. In the following, by way of example only, a simulation method will be described with reference to electronic circuits, i.e. the performance data is simulated based on a component description of the system.

Inputs and Outputs of the Methods

The first input is a system description under the form of a components list for the system, e.g. a netlist 4. This netlist 4 is parameterized in terms of the design variables, that is the design variables such as transistor areas are linked to each component. These are the variables that can be modified to achieve a particular wanted circuit behavior. These variables can be any variable that influences the circuit's behavior. Examples are operating point node voltages, operating point drain currents, bias voltages, bias currents, device parameters like geometries (e.g., the width and length of a MOS transistor, base-emitter area of a bipolar junction transistor, the element value of a passive) or mismatch parameters, technological parameters (e.g. the doping levels, the oxide gate thickness) or environmental parameters (e.g., the temperature, the radiation level). The netlist 4 can be any circuit-level netlist, e.g. a parameterized SPICE netlist or the netlist used in the application example described below with respect to FIG. 10.

The second input is a chosen hypervolume 3 (e.g. a hypercubical subspace) of the multidimensional vector input space composed by the design variables. This hypervolume 3 will define the area of interest of the model. Extrapolation beyond this hypervolume 3 may result in greater inaccuracy. Selecting a large volume may reduce the accuracy of the model in detail. For example, for every design variable, a lower bound and an upper bound is specified. An example of a description of this hypercubical subspace can be found in the application example described with reference to FIG. 10.

The output is a set of canonical posynomial models. These are posynomial functions in canonical form formulated in terms of the design variables. The function values of these functions are an approximation of the performance values realized by the behavior of the original circuit. This output then can be used as a design assistance aid for circuit designers (who can interpret the models and use the information of the models to design the circuit). The output also can be used in a numerical optimization loop to determine a set of design variable values that impose the wanted circuit behavior. As the models are in canonical form, they can be used without modification in any geometric programming software program (see, e.g. [4]).

Generally the models may be used for a variety of applications:

a) To modify an operating parameter of a physical system, for instance in a method step, e.g. raise or lower a temperature in response to a change in another variable to maintain the performance of the system within specification, Thus the present invention also includes controlling a system based on use of the models generated.

b) To modify the dimensions or characteristics of a component of the system, e.g. the size of a transistor, and to implement the system with this changed component, e.g. produce the relevant electronic circuit with the optimized component characteristics, c) To add or remove components of the system, d) To perform trade-offs—e.g. between transistor size and cost, e) To perform sensitivity analysis, e.g. how sensitive performance is with respect to transistor size, f) To optimize the system in any other way, e.g. by changing components, reducing sizes, weights, areas.

g) To modify a subsequent or preceding dependent process, e.g. in semiconductor processing to alter an etching step after a doping step has been carried out by inputting actual operating parameters of the first step into a model of this process generated in accordance with the present invention. The subsequent etching process is then adapted by use of a model of that process according to the present invention or another model to provide the planned result despite a deviation in operating conditions during doping.

h) To change a component added to the system, e.g. the quantity, temperature, granulation, acidity, humidity of a raw material introduced into the system during as part of its operation.

All input and/or output data as well as all intermediate calculations and a representation of the posynomial model generated in accordance with the present invention can be present in a computer's memory (for example but not limited to: RAM, ROM, PROM, EPROM, EEPROM), on any storage medium whether it is magnetic (for example but not limited to: hard disk, floppy disk, tape) or optical (for example but not limited to: CDROM, CDR, CDRW, DVD, DVD-R, DVD-RAM/RW) or magneto-optical (for example but not limited to: MO-disk), on paper (for example but not limited to: written, printed).

Performance Calculation

Figure 3:
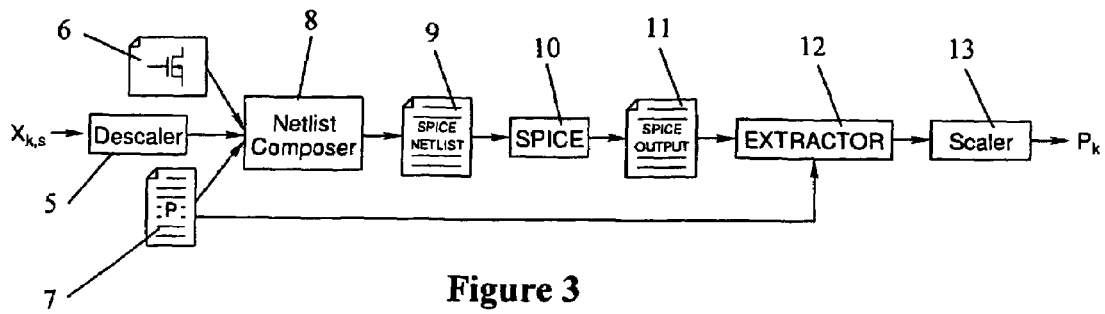
FIG. 3: Simulation-based performance calculation for use as an input to the methods and systems of the present invention.

Using techniques from "Design of Experiments", for example, a normalized list of sample points $\{X_{k,s}|k=[1:a]\}$ is selected within the fitting hypercube 3. Every sample point corresponds to a single experiment. The performance calculation step can be observed in more detail in FIG. 3. First, the normalized sampling point is denormalized using the inverses of the mapping formulae (like equations (7) or (8)) in step 5. Together with the parameterized netlist 6 and the performance specification 7 a fully specified SPICE netlist 9 is composed in the composer 8. Feeding this netlist 9 (the first input) to a numerical simulator 10 (e.g., SPICE and its commercially available derivatives), a numerical simulation is performed leading to an output file 11 containing numerical simulation results. These results can be embedded in a plain text file or in a binary file, for example. Out of this results file the performance values $P_k$ to be modeled are then extracted in step 12. The results are scaled as necessary in step 13.

This performance calculation step is carried out for every experiment. All these experiments can be run on a computer in series or in parallel on a network of computers attached in a network (for example, but not limited to LAN, WAN) or using parallel processors.

Model Fitting

The Posynomial Model Filling Engine 2 then fits a posynomial template to this numerical performance data set. Two embodiments of the present invention solve this posynomial model fitting problem. Numerical data preparation techniques like factor screening and principal component analysis, can be used in conjunction to the proposed modeling approach, prior to the model fitting process to reduce unwanted or unnecessary dimensionality.

Model Quality Assessment

In order to assess the fit-quality quality of the generated models, a quality-of-fit parameter q can be used. This fit quality is useful to decide whether the models are adequate or need adjustment. The starting point for this parameter is a measure of the deviation, e.g. the root mean square of the deviation in the a sampling points. This parameter is then normalized by division with the performance range of the sampling points:

$$q = \sqrt{\frac{\frac{1}{a}\sum_{k=1}^{a}(f(X_k)-p_k)^2}{c+\max_{k=1}^{a}(p_k)-\min_{k=1}^{a}(p_k)}} \quad (14)$$

In eq. (14), c is a constant to avoid error overestimation when the performance range approaches zero.

However, using verification points located within the fitting hypercube (not coinciding with the sampling points) yields a more realistic quality verification yardstick.

Three relative quality figures may be used, defined as $q_{oc}$: the relative model deviation in the center point, $q_{tc}$: the quality figure of eq. (14) evaluated in sampling points located in the interior of the fitting hypercube, and $q_{wc}$: the quality figure of eq. (14) evaluated in the original sampling points used for the model generation

2 Two Model Generation Techniques

2.1.1 The Indirect Fitting Method

Figure 4:
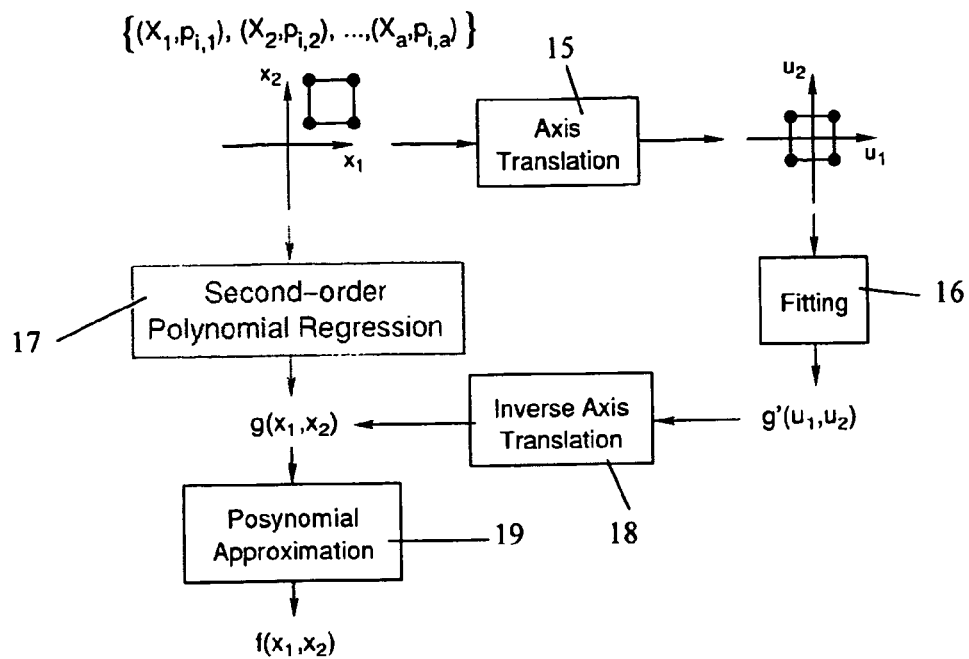
FIG. 4: schematic flow digram of the indirect fitting method in accordance with an embodiment of the present invention.

The indirect-fitting embodiment of the present invention is based on the fact that the signomial fitting problem reduces to solving an overdetermined set of linear equations in the least-squares sense when using a Euclidian norm in eq. (12), see [5]. The outline of the indirect fitting method is depicted in FIG. 4. Optionally, the dataset $\{(X_1, p_{i,1}), X_2, p_{i,2}), \ldots, (X_a, p_{i,a})\}$ is first transformed in step 15 into a dataset that is located symmetrically around the origin of the X plane. Though the transformation of variables is optional and can be left out, it makes the parametric regression of the polynomial more stable from a numerical point of view. Afterwards an $n^{th}$ order polynomial, e.g. a second-order polynomial is fitted in step 16 or 17 (depending on whether transformation 15 has been performed or not) such as to minimize the error in the sampling points. The skilled person is aware of many methods of optimizing a fit of which the least squares error method is only one. This can be done using standard linear algebra, e.g., using LU decomposition or even better QR-factorization—see [5]. When transformation 15 has been carried out an inverse transform in step 18 is performed. The resulting $n^{th}$ order, e.g. the second-order polynomial, is approximated by a posynomial expression in step 19, to generate the resulting model. The nature of the posynomial approximation step is to minimize the (nominal and first derivative) error in the centre of the fitting hypercube.

This way it is possible to generate posynomial models of the form $$p(X) = \sum_{\substack{k=1,0,1 \\ \neg((k=-1)\wedge(l=-1))}} \sum_{l=-1,0,1} \left(\sum_{i=1}^{n}\sum_{j=1}^{n}(c_{i,k,j,l}x_i^k x_j^l)\right) \quad (15)$$

with n the number of design parameters and $x_{i,k,j,l}$ positive.

How the second-order polynomial model is converted in an approximate posynomial model will now be explained. Consider the generic n-dimensional second-order polynomial model:

$$f(X) = c_0 + \sum_{i=1}^{n}(c_i x_i) + \sum_{i=1}^{n}(c_{i,i}x_i^2) + \sum_{i=1}^{n}\sum_{j=i+1}^{n}(c_{i,j}x_i x_j) \quad (16)$$

The terms having a positive coefficient $c_i$, $c_{i,i}$, $c_{ij}$ are monomial terms. The terms that have a negative coefficient are approximated around a center point $X^*=(x_1^*, x_2^*, \ldots, x_n^*)^T$ by posynomial approximations as follows:

negative linear terms: $c_i<0$ $$c_i x_i \approx \frac{d_i}{x_i} + b_i \quad (17)$$

with $d_i$ and $b_i$ chosen such that the function value and the first derivative are maintained, i.e.:

$$d_i = -c_i(x_i^*)^2$$

$$b_i = 2c_i x_i^* \quad (18)$$

negative interaction terms: $c_{i,j}<0$ $$c_{i,j}x_ix_j \approx \frac{d_{i,j}x_j}{x_i} + b_{i,j}x_j \quad (19)$$

with $d_{ij}$ and $b_{ij}$ chosen such that the function value and the first derivative are maintained, i.e.:

$$d_{i,j}=-c_{i,j}(x_i^*)^2$$

$$b_{i,j}=2c_{i,j}x_i^* \quad (20)$$

negative quadratic terms: $c_{i,i}<0$ $$c_{i,i}x_i^2 \approx \frac{d_{i,i}}{x_i} + b_{i,i} \quad (21)$$

with $d_{i,i}$ and $b_{i,i}$ chosen such that the function value and the first derivative are maintained, i.e.:

$$d_{i,i}=-2c_{i,i}(x_i^*)^3$$

$$b_{i,j}=3c_{i,i}(x_i^*)^2 \quad (22)$$

Figure 5:
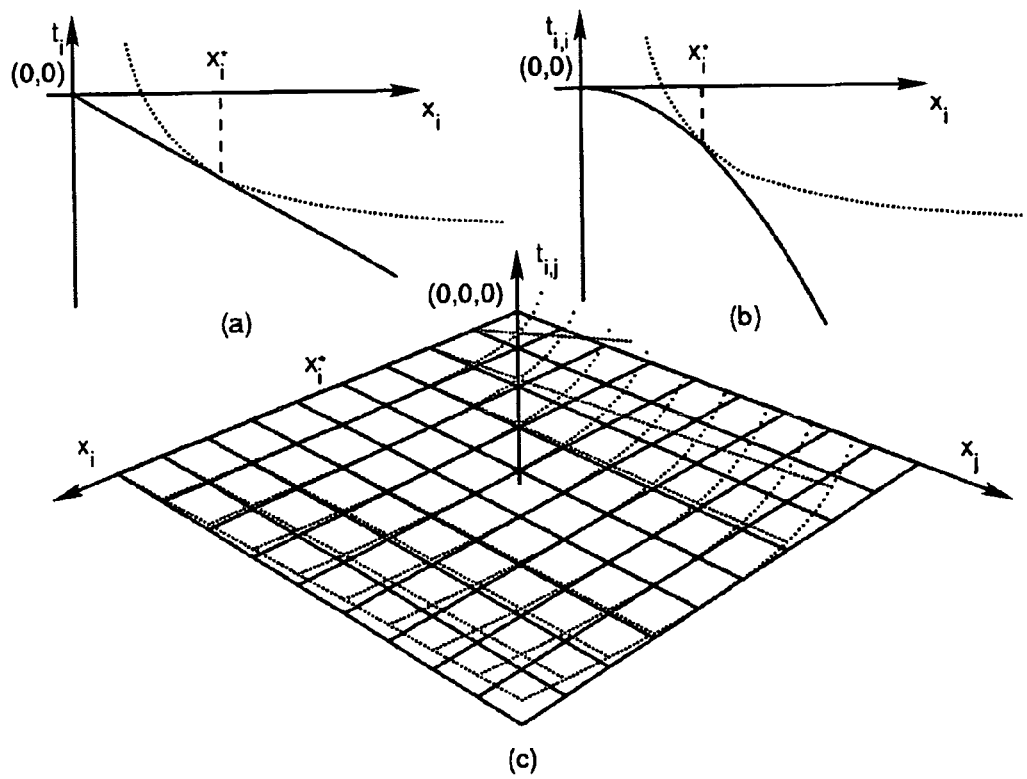
FIG. 5: posynomial approximation of (a) negative linear terms, (b) negative quadratic terms and (c) negative interaction terms. The original terms are plotted in solid lines, the approximate posynomials in dotted lines.

FIG. 5 illustrates these approximations. It is clear that these approximations make a model that favors a good fit at the center point X*. During iterative circuit sizing, this center point will move and under such conditions the model will be updated adaptively—see [2], [6].

Applying the above approximations in reverse order removes any signomial term from the model, except for the constant term that most likely becomes negative. This poses no problem since when appearing in any geometric program, this constant term can be eliminated, preserving the geometric nature of the program.

Illustrative Example of the First Embodiment

Consider a system with 2 inputs $x_1$ and $x_2$ and one output y exhibiting an input output relationship $y=h(x_1,x_2)$ with $$h(x_1,x_2)=-9(3x_1-1)(2.5x_2-1)(x_2-0.55)(1.3x_2-1) \quad (23)$$

The graphical representation of this relationship can be found in FIG. 6. Suppose we don't know this relationship, but are able to simulate or measure or observe the outputs subject to a number of input combinations in a region considered to be interesting around $(x_1,x_2)=(0.5,0.5)$. The result of these simulations or measurements or observations is a sample data set:

| $x_1$ | $x_2$ | y |
|---|---|---|
| 0.5 | 0.5 | −0.0098438 |
| 0.6 | 0.5 | −0.0252 |
| 0.4 | 0.5 | −0.001575 |
| 0.5 | 0.6 | 0.012375 |
| 0.5 | 0.4 | 0 |
| 0.575 | 0.575 | 0.013064 |
| 0.425 | 0.575 | 0.0018797 |
| 0.575 | 0.425 | −0.016539 |
| 0.425 | 0.425 | −0.0023795 |

The first step is to make this data set symmetrical with respect to the origin by applying the transformation of variables:

$$(u_1,u_2) = \frac{(x_1,x_2)-(0.5,0.5)}{0.1} \quad (24)$$

This leads to:

| $u_1$ | $u_2$ | y |
|---|---|---|
| 0 | 0 | −0.0098438 |
| 1 | 0 | −0.0252 |
| −1 | 0 | −0.001575 |
| 0 | 1 | 0.012375 |
| 0 | −1 | 0 |
| 0.75 | 0.75 | 0.013064 |
| −0.75 | 0.75 | 0.0018797 |
| 0.75 | −0.75 | −0.016539 |
| −0.75 | −0.75 | −0.0023795 |

Fitting a second-order polynomial $$g'(u_1,u_2)=a_0+a_1u_1+a_2u_2+a_{1,2}u_1u_2+a_{1,1}u_1^2+a_{2,2}u_2^2 \quad (25)$$

to these transformed sample data points using standard least-squares parametric regression, yields:

$$\begin{cases} a_0 = -0.010235 \\ a_1 = -0.0060837 \\ a_2 = +0.0088875 \\ a_{1,2} = -0.0022692 \\ a_{1,1} = +0.017306 \\ a_{2,2} = +0.011264 \end{cases} \quad (26)$$

Transforming the variables back again using eq. (24), yields:

$$g(x_1,x_2) = c_0 + c_1 x_1 + c_2 x_2 + c_{1,2} x_1 x_2 + c_{1,1} x_1^2 + c_{2,2} x_2^2 \quad (27)$$

with $$\begin{cases} c_0 = +0.63326 \\ c_1 = -0.39712 \\ c_2 = -2.2049 \\ c_{1,2} = +1.1246 \\ c_{1,1} = -0.22692 \\ c_{2,2} = +1.7306 \end{cases} \quad (28)$$

This polynomial fit has been plotted together with the original (unknown) input-output relationship in FIG. 6.

The polynomial expression $g(x_1,x_2)$ is not yet posynomial because $c_1$, $c_2$ and $c_{1,1}$ are negative. Knowing that $(x_1,x_2)=(0.5,0.5)$, we now can apply equations (21) and (22) to approximate:

$$-0.22692 x_1^2 \approx \frac{0.05673}{x_1} - 0.17019, \quad (29)$$

and equations (17) and (18) to approximate:

$$-0.39712 x_1 \approx \frac{0.09928}{x_1} - 0.39712, \quad (30)$$

$$-2.2049 x_2 \approx \frac{0.5512}{x_2} - 2.2049. \quad (31)$$

This results in the posynomial model $$f(x_1, x_2) = e_0 + e_{-1} x_1^{-1} + e_{-2} x_2^{-1} + e_{1,2} x_1 x_2 + e_{2,2} x_2^2 \quad (32)$$

with $$\begin{cases} e_0 = -2.13895 \\ e_{1,2} = +1.1246 \\ e_{-1} = +0.15601 \\ e_{-2} = +0.55123 \\ e_{2,2} = +1.7306 \end{cases} \quad (33)$$

This posynomial model has been plotted together with the original (unknown) input-output relationship and the polynomial model in FIG. 6. Its $q_{wc}$ amounts to 85%.

2.1.2 The Direct Fitting Method

The direct-fitting embodiment according to the present invention solves the posynomial-fitting problem directly. The posynomial fitting problem can be rewritten as a single objective optimization problem:

$$\text{minimize } \psi(C) = \sum_{t=1}^{a} \left( \sum_{i=1}^{m} \left( c_i \prod_{j=1}^{n} (x_{j,t}^{a_{ij}}) \right) - p_{i,t} \right)^2 \quad (34)$$

subject to: $c_i \geq 0, \forall i = 1, \ldots m$ with $x_{j,1}$ and $p_{i,1}$ respectively the value of $x_j$ and the value of $p_i$ at the $t^{th}$ experiment. The goal function (34) is a positive semi-definite second-order polynomial restricted to a convex constraint set. Therefore, the optimization problem is convex.

An algorithm of an embodiment of the direct fitting method according to the present invention can be found in FIG. 7. This algorithm assumes that the constant term of the model has coefficient $c_1$. The nature of the algorithm results in sparse posynomial models, i.e. models in which most of the coefficients are zero. The direct fitting technique is capable of fitting model coefficients of posynomial models with arbitrary real exponents.

Illustrative Example of the Second Embodiment

Consider again the example system of the above section i.e. a system with 2 inputs $x_1$ and $X_2$ and one output $y$ exhibiting an (supposedly unknown) input output relationship $y=h(x_1,x_2)$ with $$h(x_1, x_2) = -9(3x_1 - 1)(2.5 x_2 - 1)(x_2 - 0.55)(1.3 x_2 - 1) \quad (35)$$

Figure 8:
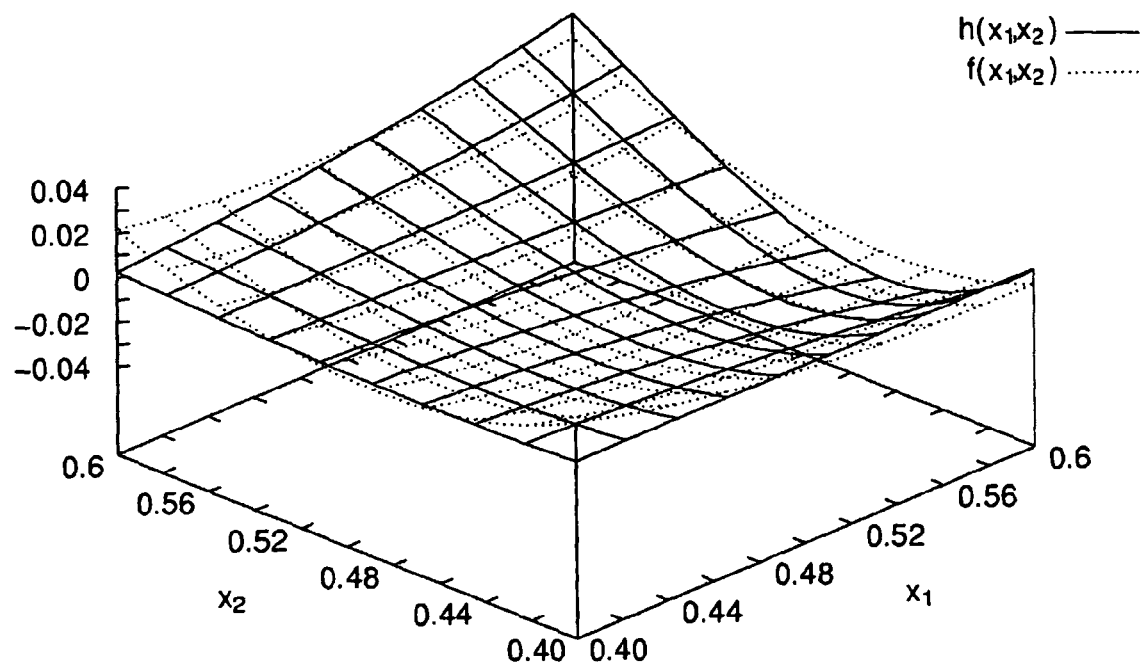
FIG. 8: graphical representation of the input-output relationship ($h(x_1,x_2)$), and the posynomial ($f(x_1,x_2)$) for the illustrative example of the direct fitting method in accordance with an embodiment of the present invention.

The graphical representation of this relationship can now be found in FIG. 8. The example sampled data set above is reused, i.e.,

| $X_1$ | $x_2$ | y |
|---|---|---|
| 0.5 | 0.5 | −0.0098438 |
| 0.6 | 0.5 | −0.0252 |
| 0.4 | 0.5 | −0.001575 |
| 0.5 | 0.6 | 0.012375 |
| 0.5 | 0.4 | 0 |
| 0.575 | 0.575 | 0.013064 |
| 0.425 | 0.575 | 0.0018797 |
| 0.575 | 0.425 | −0.016539 |
| 0.425 | 0.425 | −0.0023795 |

The goal is to fit a posynomial template such as:

$$f(x_1,x_2) = c_0 + c_1 x_1 + c_{-1} x_1^{-1} + c_2 x_2 + c_{-2} x_2^{-1} + c_{1,2} x_1 x_2 + c_{-1,2} x_1^{-1} x_2 + c_{1,-2} x_1 x_2^{-1} + c_{1,1} x_1^2 c_{2,2} x_2^2 \quad (36)$$

To illustrate the operation of the direct-fitting algorithm of FIG. 7, we will go through the algorithm step by step. The step numbers have been indicated near the line endings of the following description. We omitted the counter initializations for brevity reasons:

{1} We start by composing $\Psi(C)$

{2} We set $\Psi_{prev} = +\infty$, and chose an arbitrary starting point for C, e.g., $C=(1,1, \ldots, 1)^T$.

In the tables below every column corresponds to a vector component in the order of the coefficients of eq. (36):

$$C_1 \quad 1 \quad 1 \quad 1 \quad 1 \quad 1 \quad 1 \quad 1 \quad 1$$

{3} We enter the outer loop

{3.1} We enter the inner loop

{3.1.1} We start by minimizing $\Psi(C)$, using a minimizing routine, e.g. conjugate-gradient descent, for instance the Fletcher-Reeves algorithm of [7], but any other conjugate-gradient descent algorithm can be used, until C contains a negative component.

The result of this is:

$$C_{0.268049} \quad 0.63465 \quad 0.634708 \quad -0.495076 \quad -0.495287 \quad 0.817676 \quad 0.253805 \quad 0.253582 \quad 0.814173 \quad 0.814235$$

{3.1.3} All negative components (except for the constant term) are set to zero:

$$C_{0.26849} \quad 0.63465 \quad 0.634708 \quad 0 \quad 0 \quad 0.817676 \quad 0.253805 \quad 0.253582 \quad 0.814173 \quad 0.814235$$

and sigcounter=2

{3.1.5} The negative components that have been set to zero, are fixed if their corresponding gradient (G) component is positive, otherwise they are released.

$G_{2789.75\ 1407.18\ 1406.22\ 5637.75\ 5641.22\ 709.219\ 2842.03\ 2845.7\ 722.956\ 721.938}$

In this case, no releases occur (releasecounter=0)
As sigcounter ≠0, loop 3.1 is entered again
{3.1.1} We minimize Ψ(C), only considering non-fixed components of C. The result is:

$C_{-0273255\ \ 036161\ \ 0.361854\ \ 0\ \ 0\ \ 0.680064\ \ -0.297644\ \ -0.29898\ \ 0673895\ \ 0.674155}$

{3.1.3} Negative components are set to zero:

$C_{-0.273255\ \ 0.36161\ \ 0.361854\ \ 0\ \ 0\ \ 0.680064\ \ 0\ \ 0\ \ 0.673895\ \ 0.674155}$ and sigcounter=2
{3.1.5} The gradient is calculated to be:

$G_{826.408\ \ 422.469\ \ 421.507\ \ 1647.02\ \ 1650.5\ \ 215.377\ \ 840.349\ \ 844.035\ \ 219.799\ \ 218.777}$

Therefore, no releases occur (releasecounter=0)

As sigcounter ≠0, loop 3.1 is entered again $$G$$
$$23.1704\ \ 12.0246\ \ 11.5791\ \ 45.6092\ \ 46.9799\ \ 5.98794\ \ 22.876\ \ 24.4589\ \ 6.36435\ \ 5.86189$$

{3.1.1} We minimize Ψ(C), only considering non-fixed components of C. The result is:

$C_{0.0542176\ \ -0.180679\ \ -0.0864264\ \ 0\ \ 0\ \ 0.103928\ \ 0\ \ 0\ \ 0.0485002\ \ 0.148603}$

{3.1.3} Negative components are set to zero:

$C_{0.0542176\ \ 0\ \ 0\ \ 0\ \ 0\ \ 0.103928\ \ 0\ \ 0\ \ 0.0485002\ \ 0.148603}$ and sigcounter=2
{3.1.5} The gradient is calculated to be:

$G_{182.411\ \ 92.2459\ \ 91.9259\ \ 367.818\ \ 368.676\ \ 46.4635\ \ 185.444\ \ 186.516\ \ 47.5276\ \ 47.1512}$

Therefore, no releases occur (releasecounter=0)

As sigcounter ≠0, loop 3.1 is entered again

{3.1.1} We minimize Ψ(C), only considering non-fixed components of C. The result is:

$C_{-0.0103604\ \ 0\ \ 0\ \ 0\ \ 0\ \ 0.0145807\ \ 0\ \ 0\ \ -0.066577\ \ 0.0806476}$

{3.1.3} Negative components are set to zero:

$$C$$
$$-0.0103604\ \ 0\ \ 0\ \ 0\ \ 0\ \ 0.0145807\ \ 0\ \ 0\ \ 0\ \ 0.0806476$$

and sigcounter=1

{3.1.5} The gradient is calculated to be:

Therefore, no releases occur (releasecounter=0)
As sigcounter ≠0, loop 3.1 is entered again
{3.1.1} We minimize Ψ(C), only considering non-fixed components of C. The result is:

$$C$$
$$-0.00965779\ \ 0\ \ 0\ \ 0\ \ 0\ \ -0.117002\ \ 0\ \ 0\ \ 0\ \ 0.140514$$

{3.1.3} Negative components are set to zero:

$$C$$
$$-0.00965779\ \ 0\ \ 0\ \ 0\ \ 0\ \ 0\ \ 0\ \ 0\ \ 0\ \ 0.140514$$

and sigcounter=1
{3.1.5} The gradient is calculated to be:

$$G$$
$$39.9806\ \ 20.3827\ \ 20.3234\ \ 80.0734\ \ 79.8655\ \ 10.3363\ \ 40.7957\ \ 40.8077\ \ 10.5986\ \ 10.4841$$

Therefore, no releases occur (releasecounter=0)

As sigcounter ≠0, loop 3.1 is entered again

{3.1.1} We minimize $\Psi(C)$, only considering non-fixed components of C. The result is:

$$C$$
$$-0.0271091\ 0\ 0\ 0\ 0\ 0\ 0\ 0\ 0\ 0.0941175$$

{3.1.3} There are no negative components, therefore: sigcounter=0

{3.1.5} The gradient is calculated to be:

-277E-15  0.393417  0.00338149  ▓▓▓▓▓  0.191479  ▓▓▓▓▓  0.661723  0.415164  -6.50E-16

Therefore, three releases can occur: releasecounter=3

As sigcounter ≡0, we stop loop 3.1

{3.2} As releasecounter ≠0, we continue loop 3

As $|\Psi(C)-\Psi_{prev}(C)|\geq\epsilon$

{3.4.1} $\Psi_{prev}(C)=\Psi(C)=0.000874915$

{3.4.2} The $4^{th}$ component of C offers the largest axiswise descent and is released -152E-12  0.00502036  ▓▓▓▓▓  -341E-12  -2.19E-12  ▓▓▓▓▓  0.0907771  0.00902691  -230E-13

We reenter loop 3.1

{3.1.1} We minimize $\Psi(C)$, only considering non-fixed components of C. The result is:

$$C$$
$$-0.0535971\ 0\ 0\ 0.0129672\ 0\ 0\ 0\ 0\ 0\ 0.0943064$$

{3.1.3} There are no negative components, therefore: sigcounter=0

{3.1.5} The gradient is calculated to be:

2745-13  0.0472088  0035033  -1235-13  ▓▓▓▓▓  0.0194842  0.155686  -010446476  0.072012  9.166-14

Therefore, one release can occur: releasecounter=1

As sigcounter ≡0, we stop loop 3.1

{3.2} As releasecounter ≠0, we continue loop 3

As $|\Psi(C)-\Psi_{prev}(C)|\geq\epsilon$

{3.4.1} $\Psi_{prev}(C)=\Psi(C)=0.000751718$

{3.4.2} The $5^{th}$ component of C (is the only one that can be released, and) offers the largest axiswise descent and is released.

We reenter loop 3.1

{3.1.1} We minimize $\Psi(C)$, only considering non-fixed components of C. The result is:

$$C$$
$$-0.519227\ 0\ 0\ 0.014552\ 0.150083\ 0\ 0\ 0\ 0\ 0.708238$$

{3.1.3} There are no negative components, therefore: sigcounter=0

{3.1.5} The gradient is calculated to be:

Therefore, two releases can occur: releasecounter=2

As sigcounter ≡0, we stop loop 3.1

{3.2} As releasecounter ≠0, we continue loop 3

As $|\Psi(C)-\Psi_{prev}(C)|\geq\epsilon$

{3.4.1} $\Psi_{prev}(C)=\Psi(C)=0.00031499$

{3.4.2} The $6^{th}$ component of C offers the largest axiswise descent and is released.

We reenter loop 3.1

{3.1.1} We minimize $\Psi(C)$, only considering non-fixed components of C. The result is:

$$C$$
$$-0.908257\ 0\ 0\ 0.0877131\ 0.203546\ 0.608622\ 0\ 0\ 0\ 0.62458$$

{3.1.3} There are no negative components, therefore: sigcounter=0

{3.1.5} The gradient is calculated to be:

$$G_{3.46E\text{-}10\ 0.020256\ -0.000364089\ 8.30E\text{-}10\ 464E\text{-}10\ 1.07E\text{-}10\ 0.0373127\ 0.0741838\ 0.0317796\ 1.32E\text{-}10}$$

Therefore, only one release can occur: releasecounter=1
As sigcounter $\equiv 0$, we stop loop 3.1
{3.2} As releasecounter $\neq 0$, we continue loop 3
As $|\Psi(C)-\Psi_{prev}(C)| \geqq \varepsilon$
{3.4.1} $\Psi_{prev}(C) \rightleftharpoons \Psi(C)=0.000237551$
{3.4.2} The $3^{rd}$ component of C offers the largest axiswise descent and is released.

We reenter loop 3.1
{3.1.1} We minimize $\Psi(C)$, only considering non-fixed components of C. The result is:

$$C_{-2.54615\ 0\ 3.3635\ 0.083255\ 0.469989\ 0.585778\ 0\ 0\ 0\ -1.62208}$$

{3.1.3} Negative components are set to zero:

$$C_{-2.54615\ 0\ 3.3635\ 0.083255\ 0.469989\ 0.585778\ 0\ 0\ 0\ 0}$$

and sigcounter=1
{3.1.5} The gradient is calculated to be:

$$G_{564.452\ 282.291\ 292.726\ 1150.56\ 1107.83\ 146.385\ 596.578\ 554.081\ 143.836\ 154.309}$$

Therefore, no releases occur (releasecounter =0)

As sigcounter $\neq 0$, loop 3.1 is entered again
{3.1.1} We minimize $\Psi(C)$, only considering non-fixed components of C. The result is:

$$C_{-2.58881\ 0\ 3.34137\ -0.00370497\ 0.386259\ 0.574715\ 0\ 0\ 0\ 0}$$

{3.1.3} Negative components are set to zero:

$$C_{-2.58881\ 0\ 3.34137\ 0\ 0.306259\ 0.574715\ 0\ 0\ 0\ 0}$$

and sigcounter=1

{3.1.5} The gradient is calculated to be:

$$G_{22.2127\ 13.3523\ 23.6567\ 35.9035\ -6.29517\ 12.9407\ 43.4\ 1.43443\ 7.89143\ 18.2341}$$

Therefore, no releases can occur: releasecounter=0

As sigcounter $\neq 0$, loop 3.1 is entered again
{3.1.1} We minimize $\Psi(C)$, only considering non-fixed components of C. The result is:

$$C_{-2.80783\ 0\ 2.94317\ 0\ 0.670788\ -0.13864\ 0\ 0\ 0\ 0}$$

{3.1.3} Negative components are set to zero:

$$C_{-2.80783\ 0\ 2.94317\ 0\ 0.670788\ 0\ 0\ 0\ 0\ 0}$$

and sigcounter=1
{3.1.5} The gradient is calculated to be:

$$G_{47.2783\ 24.0316\ 24.1928\ 94.4373\ 94.7034\ 12.271\ 48.428\ 48.2267\ 12.3959\ 12.6674}$$

Therefore, no releases can occur: releasecounter=0

As sigcounter $\neq 0$, loop 3.1 is entered again
{3.1.1} We minimize $\Psi(C)$, only considering non-fixed components of C. The result is:

$$C_{-0.979816\ 0\ 1.02671\ 0\ 0.227234\ 0\ 0\ 0\ 0\ 0}$$

{3.1.3} There are no negative components, therefore: sigcounter=0
{3.1.5} The gradient is calculated to be:

$$4.36E\text{-}14\ 0.392417\ -1.36E\text{-}13\ \ \ \ \ -1.55E\text{-}14\ 0.174572\ \ \ \ \ \ 0.874931\ 0.394813\ 0.000456896$$

Therefore, two releases can occur: releasecounter=2

As sigcounter $\equiv 0$, we stop loop 3.1
{3.2} As releasecounter $\neq 0$, we continue loop 3
As $|\Psi(C)-\Psi_{prev}(C)| \geqq \varepsilon$
{3.4.1} $\Psi_{prev}(C) \rightleftharpoons \Psi(C)=0.00046495$
{3.4.2} The $4^{th}$ component of C offers the largest axiswise descent and is released We reenter loop 3.1
{3.1.1} We minimize $\Psi(C)$, only considering non-fixed components of C. The result is:

$$C_{-1.04498\ 0\ 1.0624\ 0.0145605\ 0.235881\ 0\ 0\ 0\ 0\ 0}$$

{3.1.3} There are no negative components, therefore: sigcounter=0

{3.1.5} The gradient is calculated to be:

$$G_{-4.16E\text{-}13\ 0.00479433\ -1.43E\text{-}13\ -0.28E\text{-}13\ -8.15E\text{-}13\ -0.0192396\ 0.0860679\ 0.0903196\ 0.00868686\ 0.00045763}$$

Therefore, one release can occur: releasecounter=1

As sigcounter ≠0, we stop loop 3.1

{3.2} As releasecounter ≠0, we continue loop 3

As $|\Psi(C)-\Psi_{prev}(C)| \geq \epsilon$

{3.4.1} $\Psi_{prev}(C) \rightleftharpoons \Psi(C) = 0.000310272$

{3.4.2} The 4$^{th}$ component of C offers the largest axiswise descent and is released We reenter loop 3.1

{3.1.1} We minimize $\Psi(C)$, only considering non-fixed components of C. The result is:

$$C_{-1.3712\ 0\ 0.93787\ 0.0874525\ 0.279171\ 0606385\ 0\ 0\ 0\ 0}$$

{3.1.3} There are no negative components, therefore: sigcounter=0

{3.1.5} The gradient is calculated to be:

$$G_{-4.27E\text{-}11\ 0.0199778\ -5.35E\text{-}11\ 2.87E\text{-}11\ -5.77E\text{-}11\ -4.45E\text{-}11\ 0.038643\ 0.0737952\ 0.0313621\ 0.000461302}$$

Therefore, no releases can occur: releasecounter=0

As sigcounter ≡0, we stop loop 3.1

{3.2} As releasecounter ≡0, we stop loop

This concludes the algorithm.

The resulting posynomial model is:

$$f(x_1, x_2) = c_0 + c_{-1}x_1^{-1} + c_2 x_2 + c_{-2}x_2^{-1} + c_{1,2}x_1 x_2 \quad (37)$$

with $$\begin{cases} c_0 = -1.3712 \\ c_{-1} = +0.93787 \\ c_2 = +0.0874525 \\ c_{-2} = +0.279171 \\ c_{1,2} = +0.606385 \end{cases} \quad (38)$$

Its $q_{wc}$ amounts to 13.3%.

3 Use of the Generated Models

The models generated in accordance with the present invention can be used for many purposes, e.g. a few examples are given below:

1. They can be used as a design aid to assist designers in understanding the key design variables and their effect on the performance of a circuit they have to analyze.

2. They can be used to speed up simulations using macromodels that use the posynomial performance models.

3. They can be used as part of a geometric program to find the optimal set of design variables that fulfills all user-specified constraints and is optimized towards a specific goal.

Use 1 will be exemplified below with reference to FIGS. 11 to 14.

Using posynomial performance models as part of a behavioral model is as advantageous as using more general known models (e.g. signomial models). Therefore, no further discussion on this topic is necessary.

Using the generated models as part of a geometric program requires some further manipulations, that we will discuss now.

A performance model generated using the techniques of the present invention and in particular using the performance scaling formulae like eq. (9) or (10), can appear directly as goal function $f_0(X)$ or constraint function $f_i(X)$ in the canonical geometric programming formulation of eq. (4). If the fitting template is restricted to a monomial template, the performance model can also be used as equality constraint $g_j(X)$. The only two problems that may occur are:

1. The goal function needs to be a linear combination of more than one performance parameter. Fitting the linear combination of the performance values instead of fitting each parameter individually can easily solve this. In addition, if the weights of the linear combination are positive, the individual models still can be linearly combined without destroying the posynomiality of the resulting goal function.

2. The constant term ($c_1$) of the generated models may be negative (violating the posynomiality conditions. This burden can easily be overcome by some additional rework. Consider:

$$f(X) = c_1 + \sum_{i=2}^{m} c_i \sum_{j=1}^{n} x_j^{\alpha_{ij}} \quad (39)$$

with $c_1 < 0$.

If this model acts as goal function, the constant is irrelevant for the further optimization and be put to zero, causing the model to be posynomial after all. If this model acts as a inequality constraint, it appears in the geometric programming formulation of (4) as:

$$c_1 + \sum_{i=2}^{m} c_i \sum_{j=1}^{n} x_j^{\alpha_{ij}} \leq 1 \qquad (40)$$

which is equivalent to:

$$\sum_{i=2}^{m} \frac{c_i}{1-c_1} \prod_{j=1}^{n} x_j^{\alpha_{ij}} \leq 1 \qquad (41)$$

which in turn again complies with the requirements of eq. (4), knowing that the left hand of the inequality is guaranteed to be posynomial.

As optimization software in general is written to deal with canonical optimization problems (see e.g. [4]), the models are now in a state that they can be used as input for the optimizer without further rework.

3.1 Further Example of the Second Embodiment 3.1.1 Test Setup

As test case we use a high-speed CMOS OTA (see FIG. 9) in a 0.7 μm CMOS technology (from Alcatel Microelectronics, now part of AMI Semiconductor) modeled using BSIM 3v3 MOS transistor models [8]. The supply voltage is 5V. The nominal threshold voltages of this technology are 0.76V for NMOS-devices and −0.75V for PMOS-devices.

The circuit has to drive a load capacitance of 10pF. The netlist of the OTA can be found in FIG. 10.

The goal is to derive expressions for system parameters e.g. the low frequency gain ($A_{v,LF}$), the unity frequency ($f_u$), the phase margin (PM), the input-referred offset ($v_{offset}$) and the positive and negative slew rate ($SR_p$, $SR_n$) such that the models can be used in an automatic sizing approach based on geometric programming. The following specifications are targeted:

TABLE 1

| Targeted Specification Values | | |
|---|---|---|
| Performance parameter | Constraint | Value |
| $A_{v,LF}$ | ≥ | 40 dB |
| $f_u$ | Maximize | 100 MHz |
| PM | ≥ | 60° |
| $v_{offset}$ | ≤ | 1 mV |

TABLE 1-continued

| Targeted Specification Values | | |
|---|---|---|
| Performance parameter | Constraint | Value |
| $SR_p$ | ≥ | 40 V/μs |
| $SR_n$ | ≤ | −40 V/μs |

In order to comply with the geometric programming formulation (which in its direct form only supports minimization), we will fit the inverse of the characteristics that need to be maximized or that are subject to a ≥-constraint (i.e. $-A_{v,LF}$, $-f_u$, −PM and $-SR_p$). All characteristics are scaled linearly according to eq. (9), except $f_u$ which is scaled logarithmically according to eq. (10).

Figure 9:
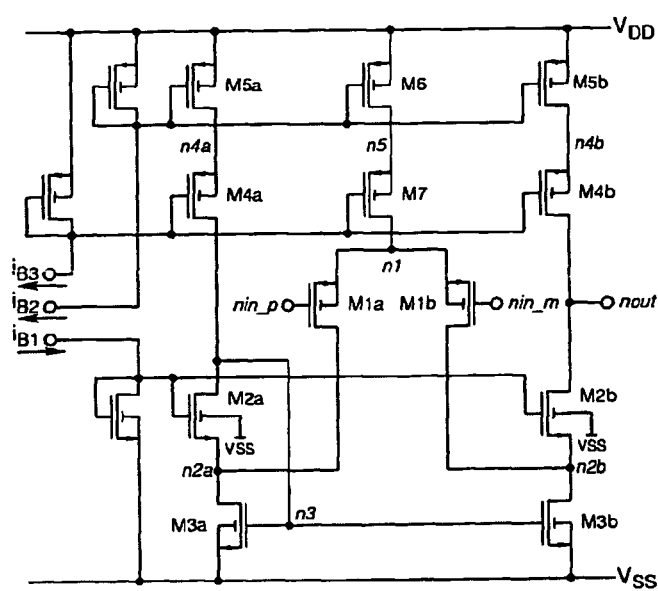
FIG. 9: schematic of a high-speed CMOS OTA

Thirteen independent design variables can be chosen for the high-speed OTA of FIG. 9. The bounded range of variables $v_i \in [lb_i, ub_i]$ is logarithmically mapped onto $x_{i,s} \in [0, 1]$ using:

$$x_{i,s} = \log\left(\frac{v_i}{lb_i}\right) / \log\left(\frac{ub_i}{lb_i}\right) \qquad (42)$$

As a consequence all scaled variables are positive (as required for the posynomial formulation). Table 2 gives an overview of the chosen design variables and their bounds.

TABLE 2

| Chosen design variables and their ranges | | | | | | |
|---|---|---|---|---|---|---|
| I | $v_i$ | $lb_i$ | $ub_i$ | I | $v_i$ | $lb_i$ | $ub_i$ |
| 1 | $V_{GS,1}$ | −0.75 V | −4 V | 2 | $V_{GS,2}$ | 0.75 V | 4 V |
| 3 | $V_{DS,2}$ | 0.1 V | 4 V | 4 | $V_{GS,3}$ | −0.75 V | −4 V |
| 5 | $V_{GS,4}$ | −0.75 V | −4 V | 6 | $V_{GS,5}$ | −0.75 V | −4 V |
| 7 | $V_{DS,5}$ | −0.1 V | −4 V | 8 | $V_{DS,6}$ | −0.1 V | −4 V |
| 9 | $I_{D,1}$ | −10 μA | −10 mA | 10 | $I_{D,2}$ | 10 μA | 10 mA |
| 11 | $I_{B,1}$ | 1 μA | 100 μA | 12 | $I_{B,2}$ | 1 μA | 100 μA |
| 13 | $I_{B,3}$ | 1 μA | 100 μA | | | | |

For each of the characteristics to model, we will derive posynomial expressions using two different sampling hybercube widths (dx=0.1, dx=0.01) around the center point ($x_i$=0.5, i=[1:13]) of the design space.

The experiments were designed using the 3-level orthognal array of strength 3 containing 243 experiments [9]. Other sampling schemes can be used as well. The performance data was generated on 16 UNIX workstations, ranging from a SUN Ultra Sparc I (with a SPECfp95 of 9) to an HP B-1000 (with a SPECfp95 of 42) using their native OS. Each simulation can be run on any computer hence any computer (or cluster of computers) can be used to perform these calculations. The simulations needed to obtain the full set of 243 sampling points took approximately 3 minutes. The simulator used was Berkeley SPICE 3f4 [10]. Any other commercially available SPICE-like simulator can be used for these simulations. Using these data the whole set of performance characteristics ($-A_{v,LF}$, $-f_u$, −PM, $v_{offset}$, $-SR_p$, $SR_n$) can be fitted.

3.1.2 Resulting Model Qualities

The resulting model qualities (obtained using eq. (14) and c=0) can be assessed in Table 3.

TABLE 3

Properties of the posynomial models

|  | Indirect fitting | | | Direct fitting | | |
|---|---|---|---|---|---|---|
|  | $q_{wc}$ | $q_{tc}$ | $q_{oc}$ | $Q_{wc}$ | $q_{tc}$ | $q_{oc}$ |
|  | | | dx = 0.1 | | | |
| $A_{v,LF}$ | 566.2% | 52.33% | −1.123% | 4.255% | 6.503% | 7.247% |
| $F_u$ | 9324% | 890.2% | 1.366% | 3.634% | 5.934% | −6.238% |
| PM | 6352% | 617.06% | 1.061% | 5.085% | 9.732% | 10.60% |
| $V_{offset}$ | 38.14% | 4.372% | −0.9814% | 0.4423% | 0.8051% | −1.056% |
| $SR_p$ | 1630% | 139.4% | −14.67% | 9.608% | 30.76% | −33.86% |
| $SR_n$ | 516.5% | 48.23% | 0.2754% | 8.0771% | 7.771% | −8.247% |
|  | | | dx = 0.01 | | | |
| $A_{v,LF}$ | 7.217% | 0.7601% | −0.3654% | 0.858% | 1.103% | −1.547% |
| $F_u$ | 6.834% | 0.8352% | 0.07038% | 0.6932% | 0.2761% | 0.1824% |
| PM | 6131% | 559.1% | 32.22% | 0.8763% | 1.118% | −0.9170% |
| $V_{offset}$ | 9.451% | 1.871% | −0.7973% | 0.8251% | 0.1151% | −0.2274% |
| $SR_p$ | 474.4% | 45.92% | −2.862% | 2.508% | 2.199% | −2.346% |
| $SR_n$ | 211.2% | 23.81% | −0.0814% | 0.3793% | 3.971% | −3.740% |

3.1.3 Resulting Models and Further Use

Figure 11A:
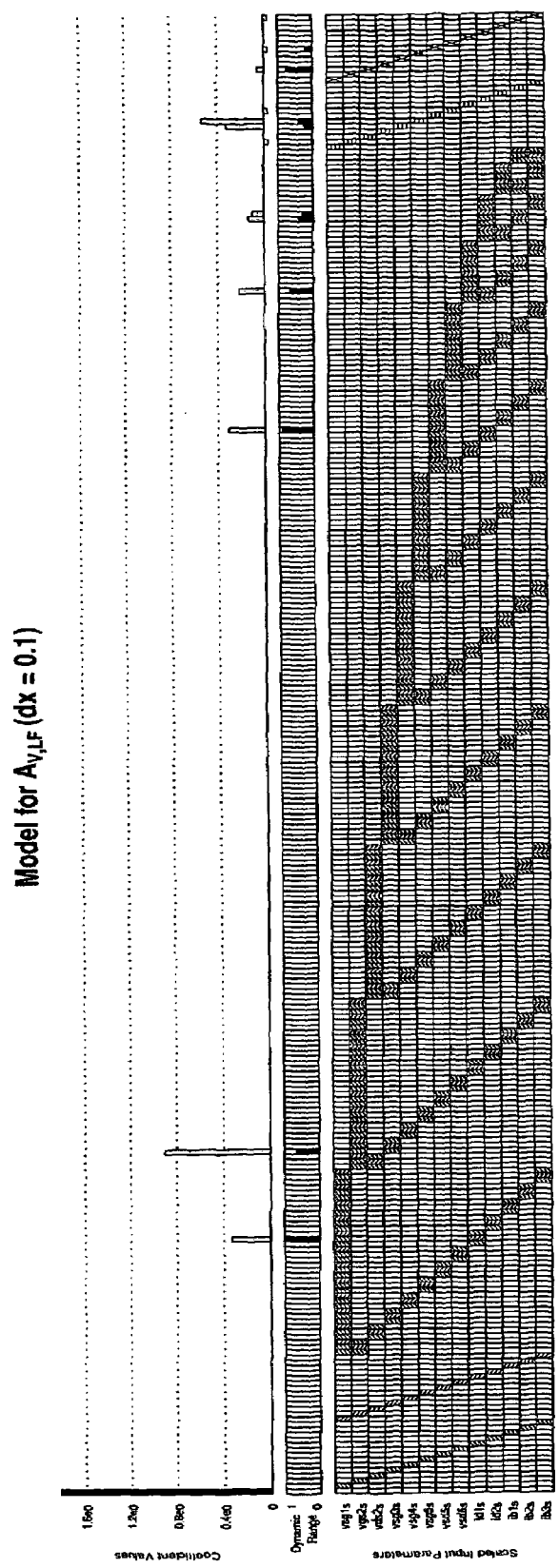
FIG. 11: graphical representations of models ($A_{v,LF}$ FIG. 11a; $f_u$ FIG. 11b; PM, FIG. 11c) generated using the direct fitting method for dx=0.1 in accordance with an embodiment of the present invention.
Figure 11B:
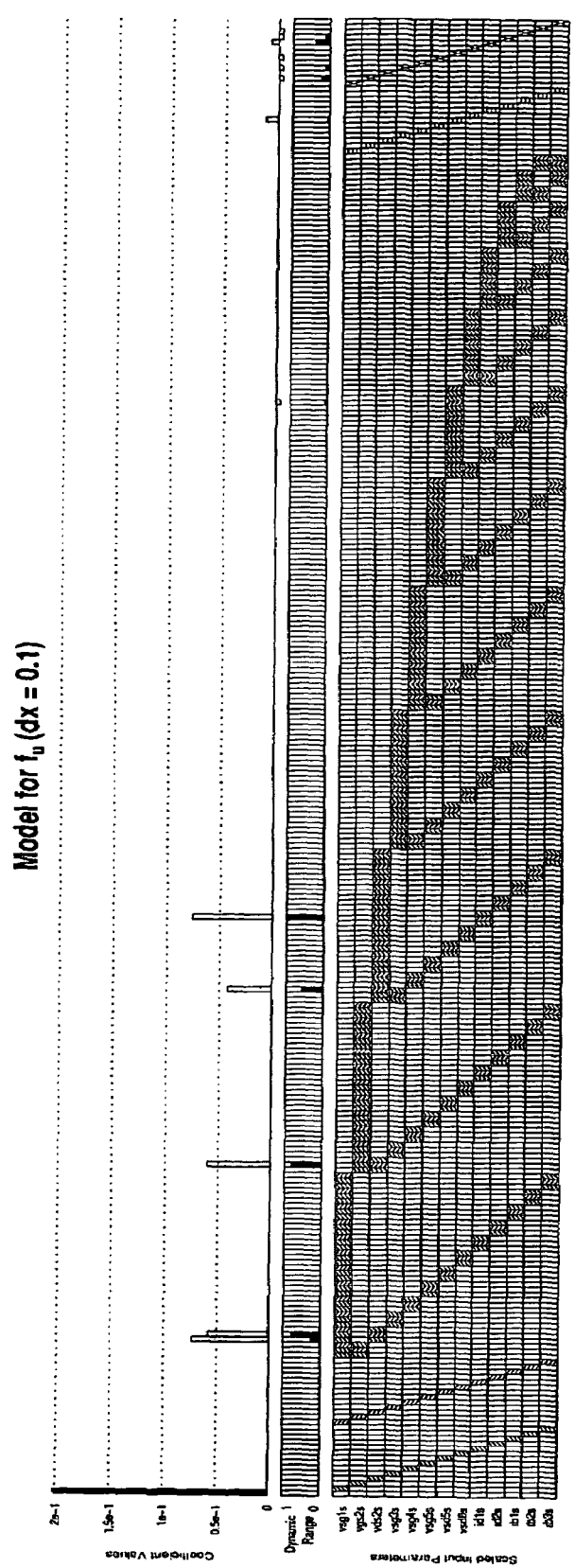
Figures 11, 11C:
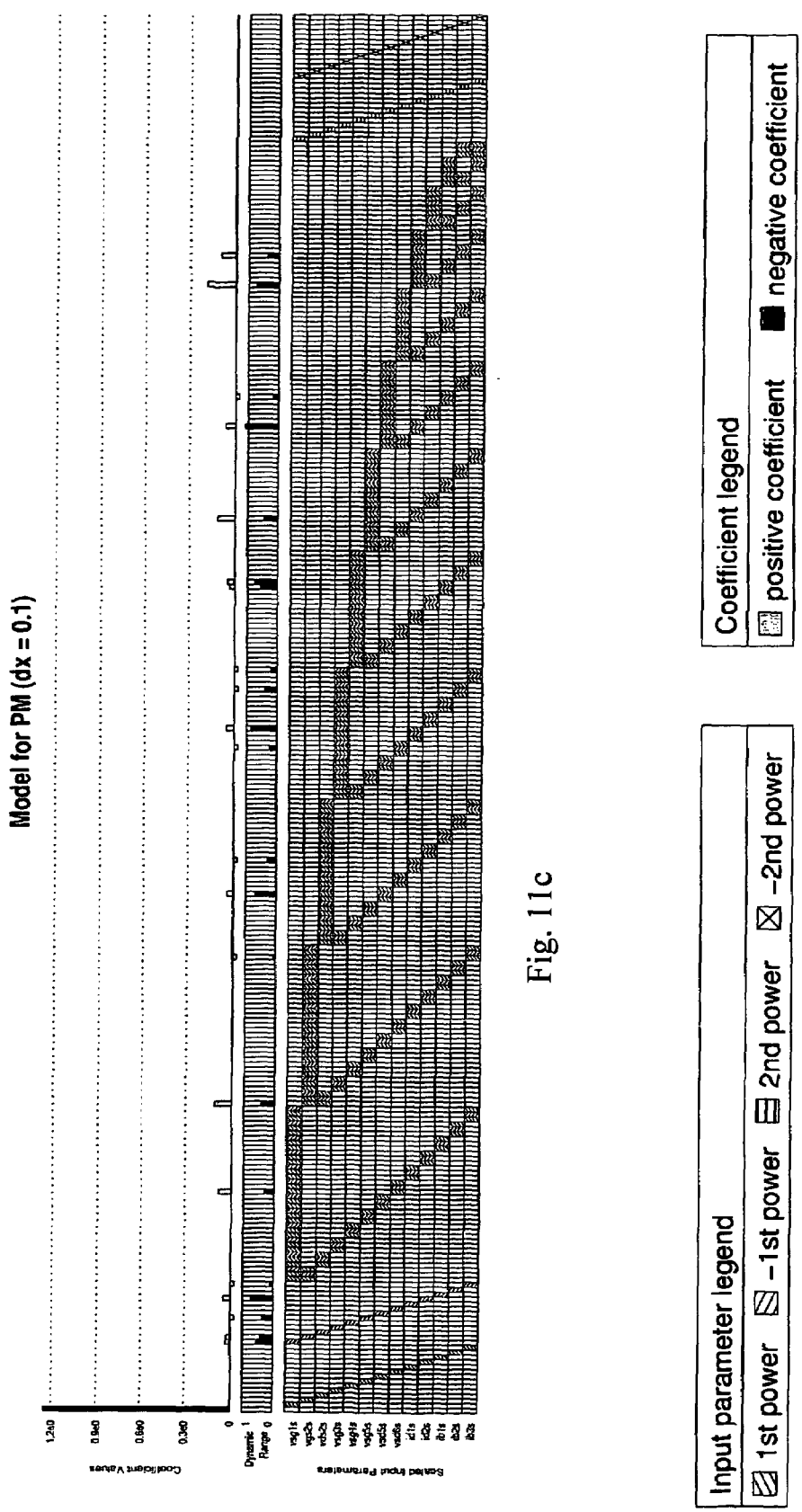
Figure 12A:
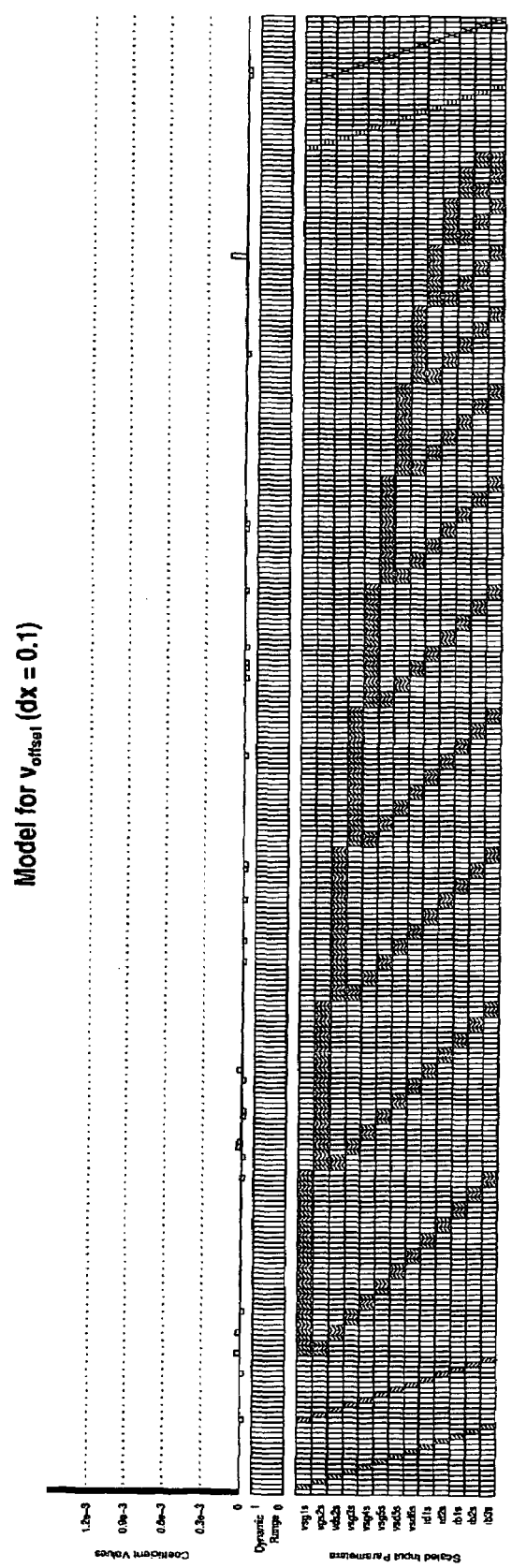
FIG. 12: graphical representations of further models ($v_{offset}$ FIG. 12a; $SR_p$, FIG. 12b; $SR_n$ FIG. 12c) using the direct fitting method for dx=0.1 in accordance with an embodiment of the present invention.
Figure 12B:
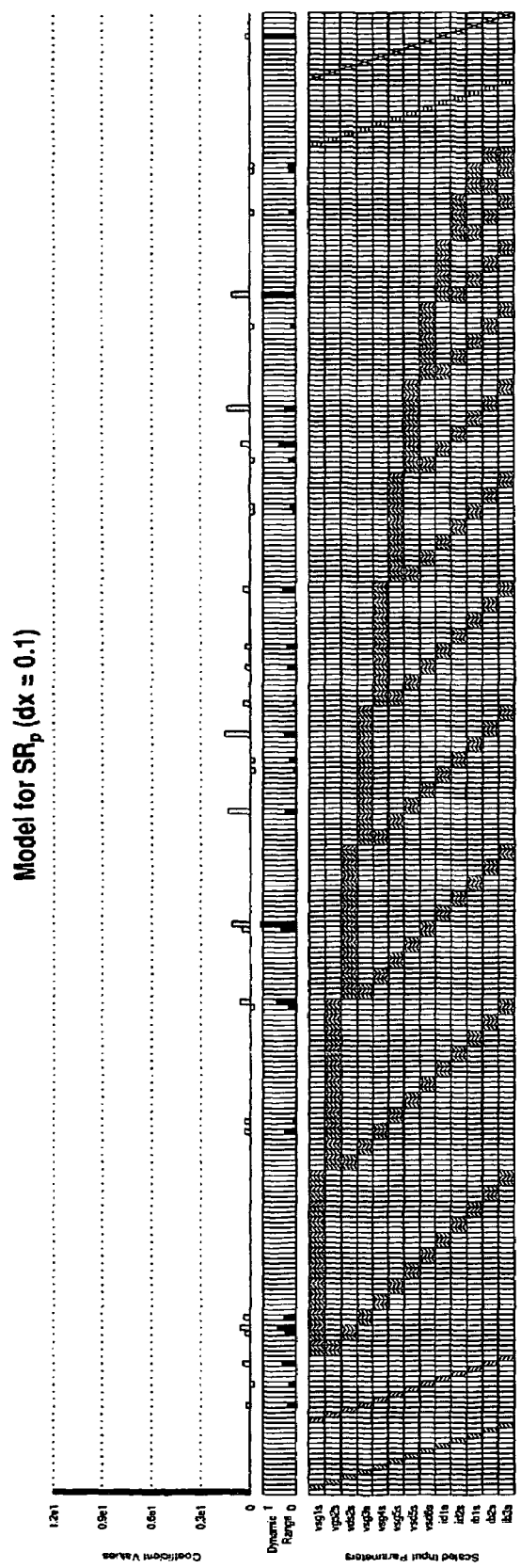
Figure 13A:
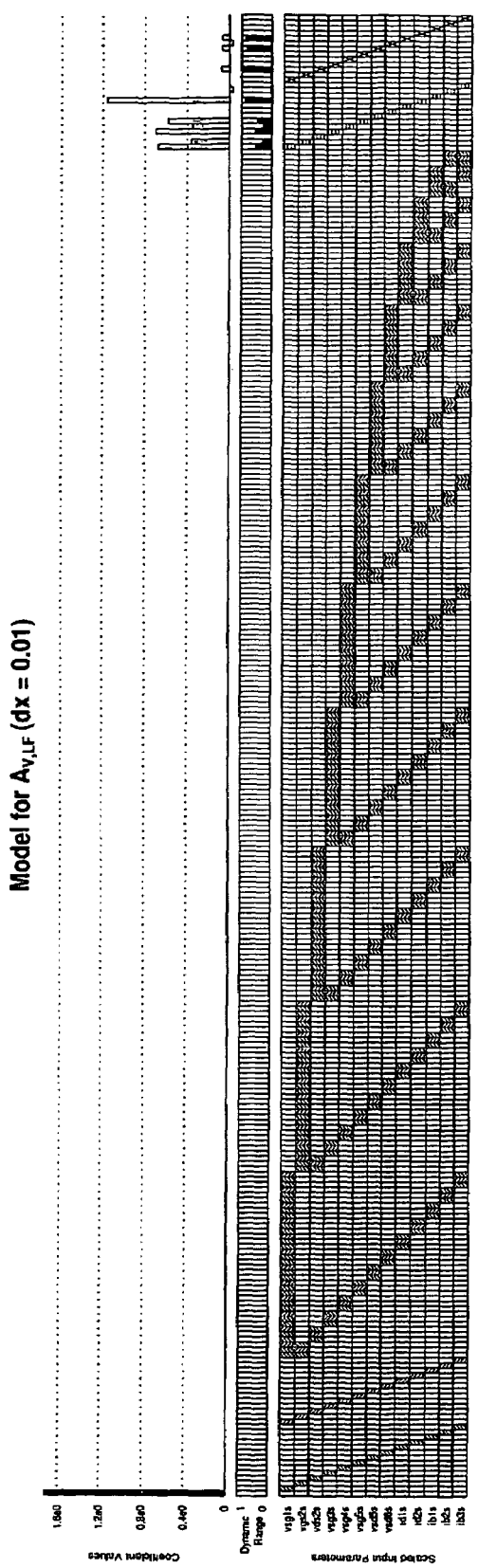
FIG. 13: graphical representations of still further models ($A_{v,LF}$, FIG. 13a; $f_u$, FIG. 13b; PM, FIG. 13c) generated using the direct fitting method for dx=0.01 in accordance with an embodiment of the present invention.
Figure 13B:
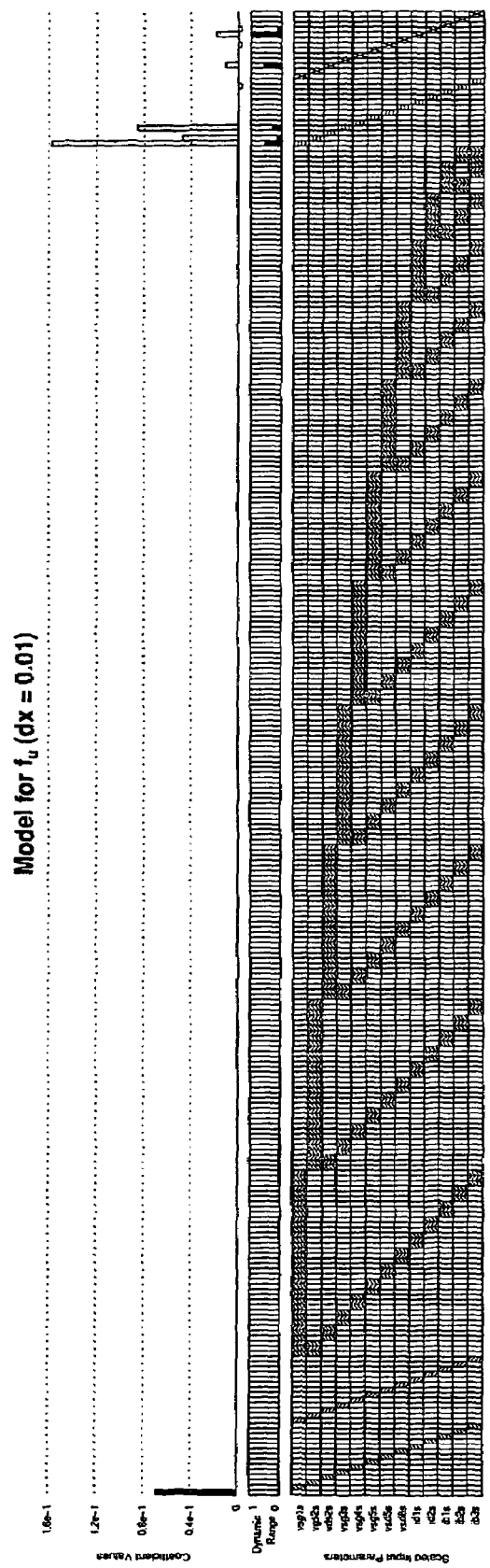
Figures 13, 13C:
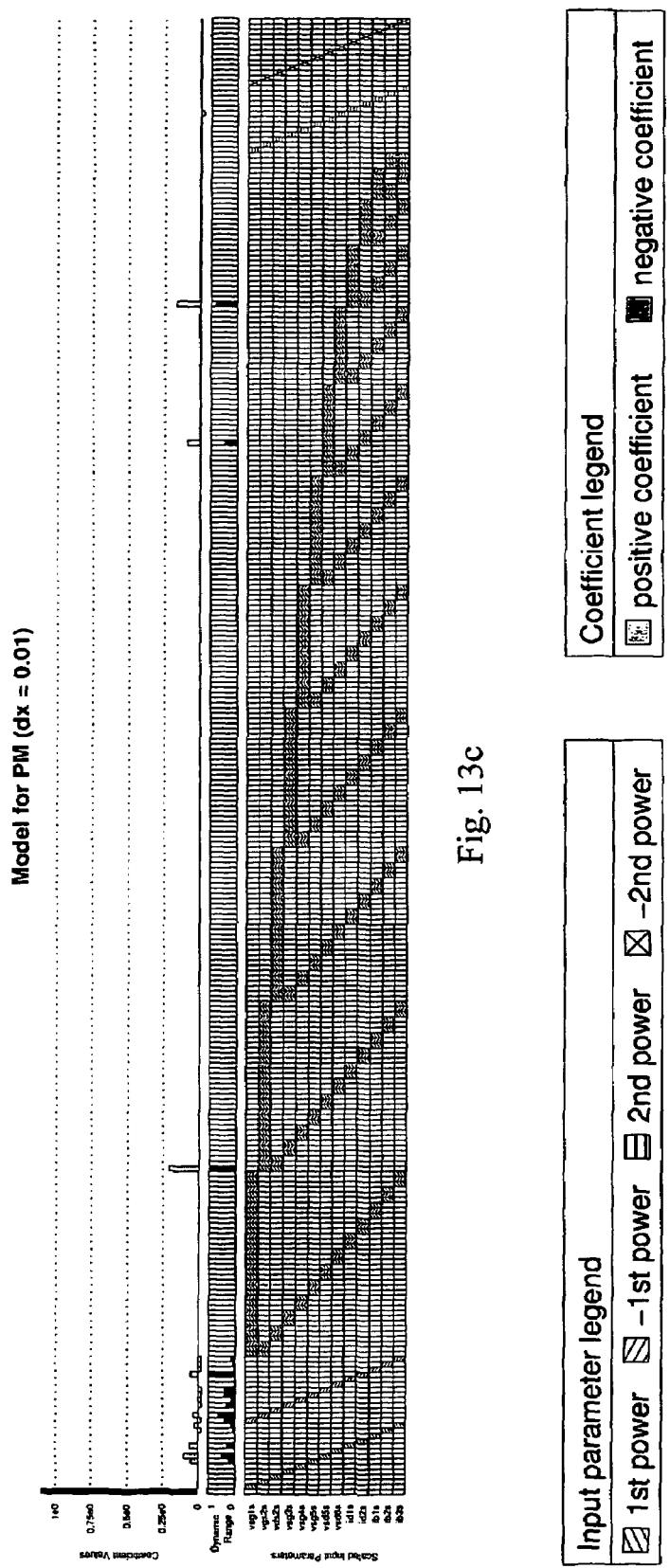
Figure 14A:
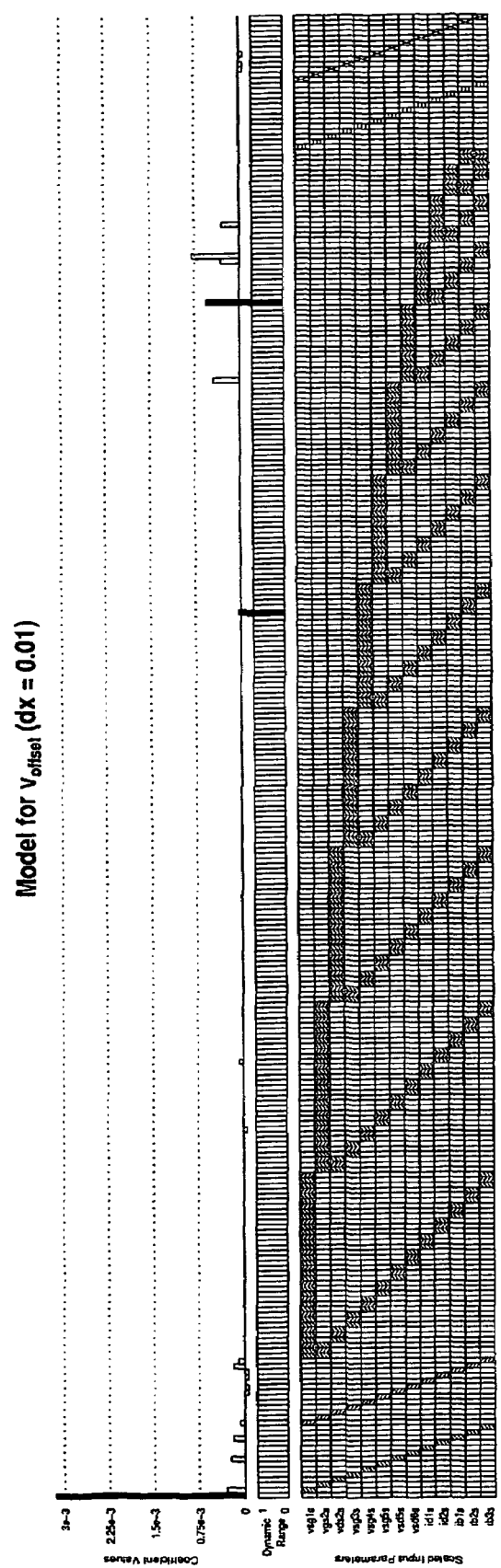
FIG. 14: graphical representations of yet models ($v_{offset}$, FIG. 14a; $SR_p$, FIG. 14b; $SR_n$, FIG. 14c) using the direct fitting method for dx=0.01 in accordance with an embodiment of the present invention.
Figure 14B:
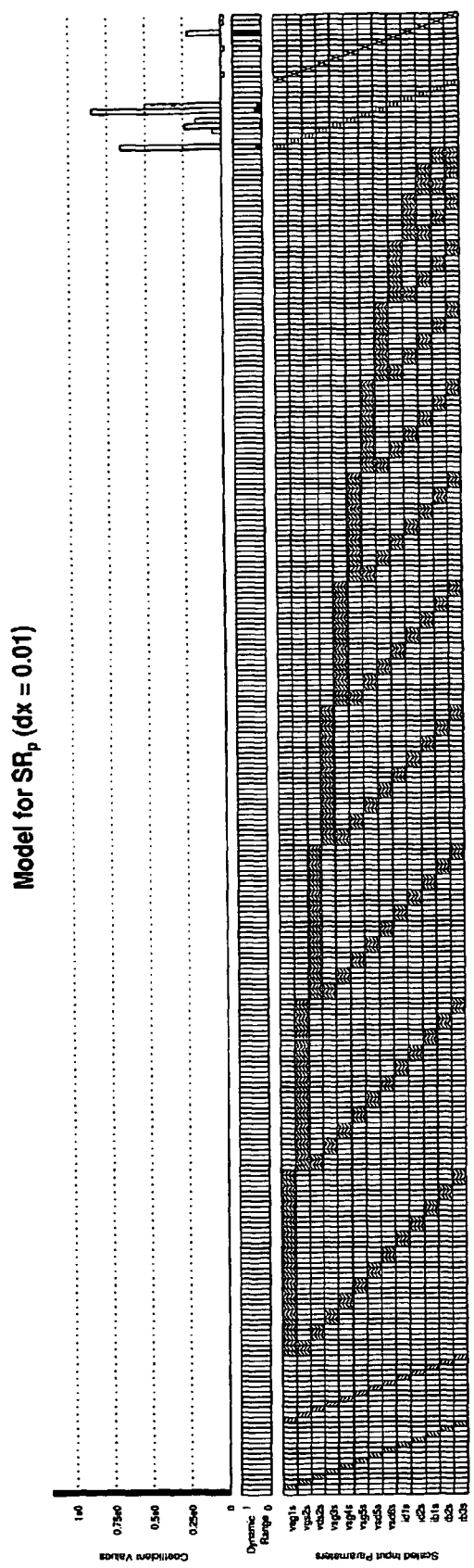
Figures 14, 14C:
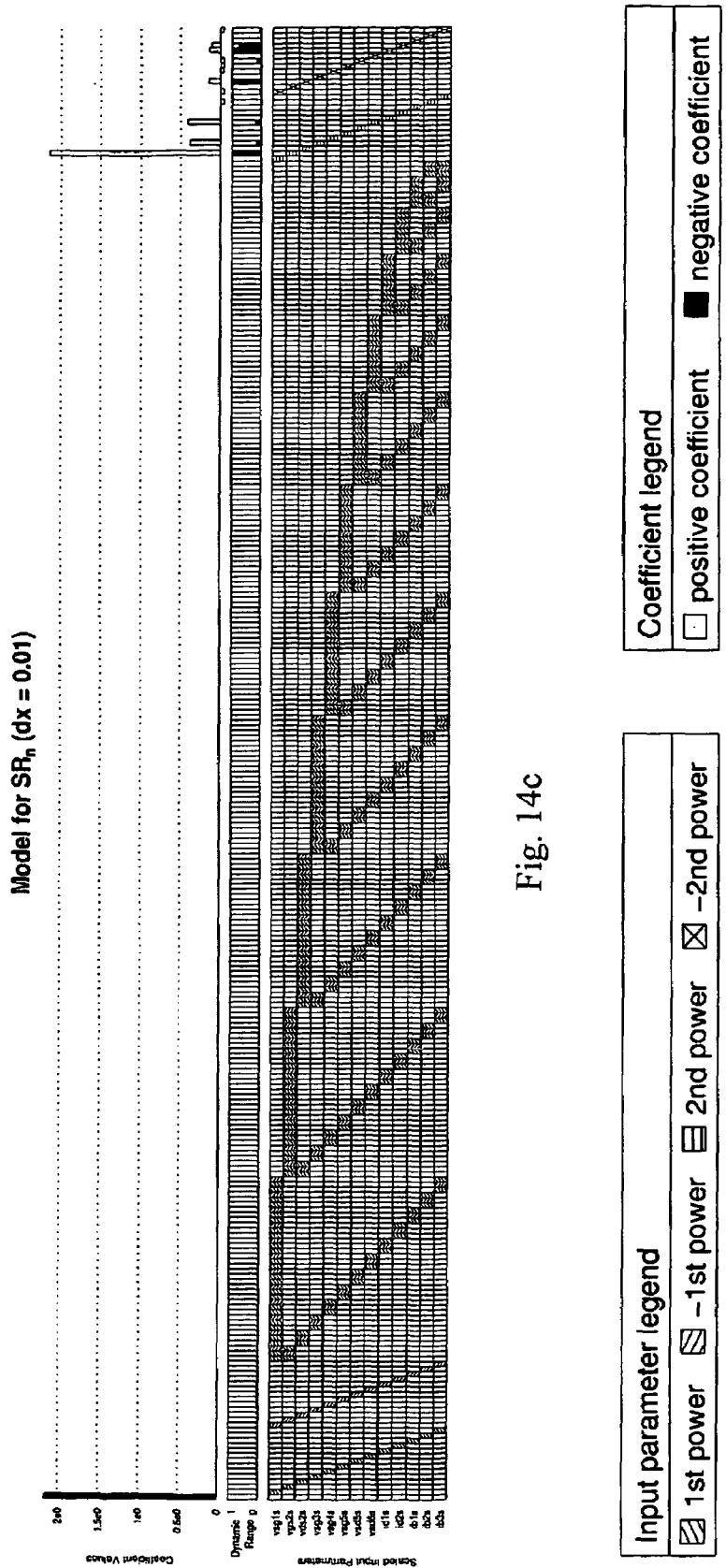

The resulting models of the direct fitting method and their sparsity can be observed in FIG. 11 and FIG. 12 (for dx=0.1) and FIG. 13 and FIG. 14 (for dx=0.01). In these figures, every row of the bottom part corresponds to a design variable $x_i$. Every column corresponds to one particular term in the model: a $x_i$, $x_j$ input parameter combination. The hatching of the cells (boxes) in the bottom part indicates the value of the exponents of the variables in the model (see also the input parameter legend). A transparent cell corresponds to a zero-valued exponent, i.e. the corresponding design variable is not present in the term. The bars appearing in the top part each represent the numerical value of a coefficient. Grey bars correspond to positive coefficients; dark bars correspond to negative coefficients. Coefficient values normally not visible on the scale, are represented by small bars below the axis. The relative dynamic ranges of the terms (i.e., the difference between the maximal value and the minimal value of a term, normalized with respect to the term for which this difference is the biggest) have been indicated by bar graphs in the middle. These bar graphs allow finding the dominant design parameters occurring in the model easily. The perfect horizontal alignment of the graphs of different models allows finding orthogonal terms, i.e. terms that allow influencing one performance characteristic significantly without deteriorating other performance characteristics. In this way, correlations between performance characteristics may be spotted very quickly. Moreover, design variables that tune different performance variables independently can be identified using these graphs.

Implementation

Figure 15:
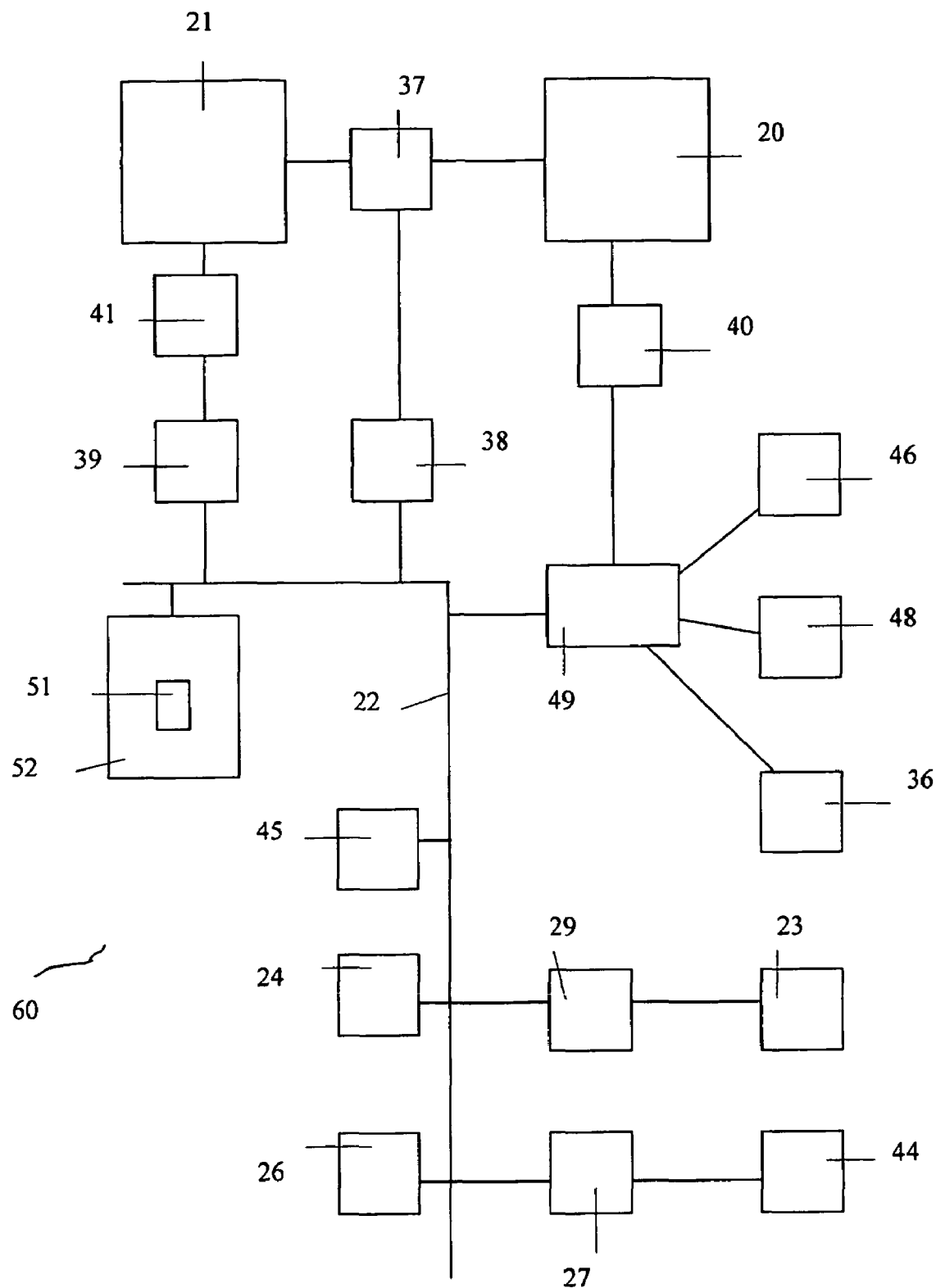
FIG. 15: schematic representation of a computing system which may be used with the present invention.

FIG. 15 is a schematic representation of a computing system which can be utilized with the methods and in a system according to the present invention. A computer 60 is depicted which may include a video display terminal 44, a data input means such as a keyboard 46, and a graphic user interface indicating means such as a mouse 48. Computer 60 may be implemented as a general purpose computer, e.g. a UNIX workstation.

Computer 60 includes a Central Processing Unit ("CPU") 45, such as a conventional microprocessor of which a Pentium IV processor supplied by Intel Corp. USA is only an example, and a number of other units interconnected via system bus 22. The computer 60 includes at least one memory. Memory may include any of a variety of data storage devices known to the skilled person such as random-access memory ("RAM"), read-only memory ("ROM"), non-volatile read/write memory such as a hard disc as known to the skilled person. For example, computer 60 may further include random-access memory ("RAM") 24, read-only memory ("ROM") 26, as well as an optional display adapter 27 for connecting system bus 22 to an optional video display terminal 44, and an optional input/output (I/O) adapter 29 for connecting peripheral devices (e.g., disk and tape drives 23) to system bus 22. Video display terminal 44 can be the visual output of computer 60, which can be any suitable display device such as a CRT-based video display well-known in the art of computer hardware. However, with a portable or notebook-based computer, video display terminal 44 can be replaced with a LCD-based or a gas plasma-based flat-panel display. Computer 60 further includes user interface adapter 49 for connecting a keyboard 46, mouse 48, optional speaker 36, as well as allowing optional physical value inputs from physical value capture devices such as sensors 40 of an external system 20. The sensors 40 may be any suitable sensors for capturing physical parameters of system 20. These sensors may include any sensor for capturing relevant physical values required for characterizing the operation or design of system 20, e.g. temperature, pressure, fluid velocity, electric field, magnetic field, electric current, voltage. For instance, system 20 may be a computer based electronic circuit design environment in which an electronic circuit is designed using CAD-CAM techniques. Alternatively, system 20 may be a processing plant of a chemical company. Additional or alternative sensors 41 for capturing physical parameters of an additional or alternative physical system 21 may also connected to bus 22 via a communication adapter 39 connecting computer 60 to a data network such as the Internet, an Intranet a Local or Wide Area network (LAN or WAN) or a CAN. This allows transmission of physical values or a representation of the physical system to be simulated over a telecommunications network, e.g. entering a description of a physical system at a near location and transmitting it to a remote location, e.g. via the Internet, where a processor carries out a method in accordance with the present invention and returns a parameter relating to the physical system to a near location.

The terms "physical value capture device" or "sensor" includes devices which provide values of parameters of a physical system to be modeled. Similarly, physical value capture devices or sensors may include devices for transmitting details of evolving physical systems. The present invention also includes within its scope that the relevant physical values are input directly into the computer using the keyboard 46 or from storage devices such as 23.

A parameter control unit 37 of system 20 and/or 21 may also be connected via a communications adapter 38. Parameter control unit 37 may receive an output value from computer 60 running a computer program for modeling a system using posynomial functions in accordance with the present invention or a value representing or derived from such an output value and may be adapted to alter a parameter of physical system 20 and/or system 21 in response to receipt of the output value from computer 60. For example, the dimension of one element of a semiconductor device may be altered based on the output, a material may be changed, e.g. from aluminium to copper, or a material may be modified, e.g. a different doping level in a semiconductor layer, based on the output.

Computer 60 also includes a graphical user interface that resides within machine-readable media to direct the operation of computer 60. Any suitable machine-readable media may retain the graphical user interface, such as a random access memory (RAM) 24, a read-only memory (ROM) 26, a magnetic diskette, magnetic tape, or optical disk (the last three being located in disk and tape drives 23). Any suitable operating system and associated graphical user interface (e.g., Microsoft Windows) may direct CPU 45. In addition, computer 60 includes a control program 51 which resides within computer memory storage 52. Control program 51 contains instructions that when executed on CPU 15 carry out basic operations of the operating system of the computer 60.

Those skilled in the art will appreciate that the hardware represented in FIG. 15 may vary for specific applications. For example, other peripheral devices such as optical disk media, audio adapters, or chip programming devices, such as PAL or EPROM programming devices well-known in the art of computer hardware, and the like may be utilized in addition to or in place of the hardware already described.

In the example depicted in FIG. 15, the computer program product in accordance with the present invention can reside in computer storage 52. However, it is important that while the present invention has been, and will continue to be, that those skilled in the art will appreciate that the mechanisms of the present invention are capable of being distributed as a program product in a variety of forms, and that the present invention applies equally regardless of the particular type of signal bearing media used to actually carry out the distribution. Examples of computer readable signal bearing media include: recordable type media such as floppy disks and CD ROMs and transmission type media such as digital and analogue communication links.

The computer program product in accordance with the present invention contains code segments for carrying out any of the methods of the present invention as described above. The methods described above may be programmed in a suitable language such as C and compiled for the relevant processor of the computer 60.

FIG. 15 and the description above discloses a computer based system having memory and a processor for generating posynomial models by fitting to numerical data linking the performance of the system to its parameters. The above description discloses the following embodiments:

1) One or both systems 20, 21 are computer systems, e.g. several computers which can be used in parallel to carry out simulation experiments to generate the input numerical data for the posynomial fitting methods of the present invention run on computer 60.

2) At least one of the systems 20, 21 is a system which is adapted or controlled using an output derived from a posynomial model generated in accordance with the present invention and running on computer 60. The derivation of the output may use geometric programming. System 20 and/or system 21 may be a physical or a non-physical system.

3) At least one of the systems 20, 21 is a physical entity such as a manufacturing process for a semiconductor product or an electronic circuit or a banking or financial system, and at least one component of system 20 and/or 21 is modified, adapted, optimized, added or removed in response to an output derived from a posynomial model generated in accordance with the present invention and running on computer 60. The derivation of the output may use geometric programming.

4) Computer 60 and/or system 20 and/or system 21 is a design environment for a physical entity and the deign is modified in response to an output derived from a posynomial model generated in accordance with the present invention.

The invention claimed is:

1. A computer based method to generate a posynomial model for the performance characteristics of a system based on numerical data of these performance characteristics by indirectly or directly fitting the posynomial model to the numerical data.

2. The method according to claim 1, wherein directly fitting includes fitting a posynomial template to the numerical data by constrained optimization of a goal function using conjugate gradient descent, the posynomial template comprising arbitrary real exponents.

3. The method according to claim 1, wherein the fitting includes fitting a signomial model to the numerical data followed by an automatic recasting into a posynomial model.

4. The method according to claim 3, wherein the the signomial model is an nth order polynomial.

5. The method according to claim 1, wherein fitting includes directly fitting a posynomial template to the numerical data, the posynomial template comprising arbitrary real exponents.

6. The method according to claim 1, wherein the posynomial is a linear summation of at least two monomials.

7. The method according to claim 1, wherein said numerical data is obtained by at least one of measurement, simulation, and observation.

8. The method according to claim 1, wherein the system is physical system.

9. The method according to claim 8, wherein said system is an electronic circuit or a semiconductor device or a micro electro-mechanical system (MEMS).

10. The method according to claim 1, wherein the system displays linear or nonlinear performance behavior.

11. The method according to claim 1, wherein the posynomial model is a specification independent model or a sparse model.

12. A model residing in a memory device, the model being for performance characteristics of a system based on numerical data of these performance characteristics and the model having been obtained by indirectly or directly fitting the posynomial model to the numerical data.

13. A method to size or optimize an electronic circuit, a semiconductor device or a micro electro-mechanical system (MEMS) based on a posynomial model, the model being for performance characteristics of the circuits device or system based on numerical data of these performance characteristics and the model been obtained by indirectly or directly fitting the posynomial model to the numerical data.

14. The method according to claim 13, wherein the posynomial model is updated adaptively during the sizing or optimization iteration.

15. The method according to claim 1, wherein posynomial model is obtained without analytically analyzing the system and/or without casting the resulting analytic equations in posynomial format and/or without approximating them in posynomial format or without a-priori generation of a simplified equation or equations.

16. The method of claim 15, wherein the generation of the posynomial performance parameter model is based on a numerical SPICE-like simulation.

17. An electronic circuit, a semiconductor device or a micro-electro-mechanical system obtained by the method of claim 13.

18. A computer system comprising a memory and a processor for generating a posynomial model for the performance characteristics of a system based on numerical data of these performance characteristics, comprising means for indirectly or directly fitting the posynomial model to the numerical data.

19. The computer system according to claim 18, wherein the means for fitting includes means for fitting a signomial model to the numerical data followed by an automatic recasting into a posynomial model.

20. The computer system according to claim 18, wherein the means for fitting includes means for directly fitting a posynomial template to the numerical data, the posynomial template comprising arbitrary real exponents.

21. The computer system according to claim 18, wherein the posynomial is a linear summation of at least two monomials.

22. The computer system according to claim 18, further comprising input means for inputting the numerical data is obtained by measurement and/or simulation and/or observation.

23. The computer system according to claim 18, further comprising geometric programming means.

24. A computer program product which when executed on a computer system having a memory and a processor generates a posynomial model for the performance characteristics of a system based on numerical data of these performance characteristics, comprising means for indirectly or directly fitting the posynomial model to the numerical data.

25. The computer program product according to claim 24, further comprising code for executing a means for fitting a signomial model to the numerical data followed by an automatic recasting into a posynomial model when the code is executed on the computer system.

26. The computer program product according to claim 24, further comprising code for executing means for directly fitting a posynomial template to the numerical data, the posynomial template comprising arbitrary real exponents, when the code is executed on the computer system.

27. The computer program product according to claim 24, wherein the posynomial is a linear summation of at least two monomials.

28. The computer program product according to claim 24, further comprising code for executing a geometric program when the code is executed on the computer system.

29. A data carrier storing a computer program product according to claim 24.

30. A method for modeling of a first system, comprising: transmitting from a near location a description of the first system to a remote location where a processing engine carries out the method in accordance with claim 1, and receiving at a near location a representation of the model.

31. A method for modeling of a first system, comprising: transmitting from a near location a description of the first system to a remote location where a processing engine carries out the method in accordance with claim 1, and receiving at a near location a value relating to at least one parameter related to the first system.

32. A method for modeling of a first system, comprising: transmitting from a near location a description of the system to a remote location where a processing engine carries out the method in accordance with claim 1, and receiving at a near location a value relating to at least one parameter related to a second system which is dependent upon the first system.

33. The method according to claim 30, wherein the first system is a physical system and the parameter is a physical parameter.

34. The method according to claim 32, wherein the second system is a physical system and the parameter is a physical parameter.

* * * * *

UNITED STATES PATENT AND TRADEMARK OFFICE
CERTIFICATE OF CORRECTION

PATENT NO. : 7,162,402 B2  Page 1 of 1
APPLICATION NO. : 10/494151
DATED : October 31, 2002
INVENTOR(S) : Walter Daems, Georges Gielen and Willy Sansen It is certified that error appears in the above-identified patent and that said Letters Patent is hereby corrected as shown below:

Column 28:
Line 59, before "physical", insert --a--;

Column 29:
Line 9, "circuits" should be --circuit,--.

Signed and Sealed this

Tenth Day of April, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,162,402 B2 |
| APPLICATION NO. | : 10/494151 |
| DATED | : January 9, 2007 |
| INVENTOR(S) | : Walter Daems, Georges Gielen and Willy Sansen |

Page 1 of 1

It is certified that error appears in the above-identified patent and that said Letters Patent is hereby corrected as shown below:

Column 28:
Line 59, before "physical", insert --a--;

Column 29:
Line 9, "circuits" should be --circuit,--.

This certificate supersedes Certificate of Correction issued April 10, 2007.

Signed and Sealed this

Eighth Day of May, 2007

JON W. DUDAS
*Director of the United States Patent and Trademark Office*